United States Patent
Tucholski

(10) Patent No.: US 9,027,242 B2
(45) Date of Patent: May 12, 2015

(54) CELL ATTACHMENT METHOD

(71) Applicant: Blue Spark Technologies, Inc., Westlake, OH (US)

(72) Inventor: Gary R. Tucholski, North Royalton, OH (US)

(73) Assignee: Blue Spark Technologies, Inc., Westlake, OH (US)

( * ) Notice: Subject to any disclaimer, the term of this patent is extended or adjusted under 35 U.S.C. 154(b) by 275 days.

(21) Appl. No.: 13/625,366

(22) Filed: Sep. 24, 2012

(65) Prior Publication Data

US 2013/0074330 A1 Mar. 28, 2013

Related U.S. Application Data

(60) Provisional application No. 61/537,706, filed on Sep. 22, 2011.

(51) Int. Cl.
| | |
|---|---|
| *H01R 43/00* | (2006.01) |
| *H05K 13/00* | (2006.01) |
| *H01M 2/30* | (2006.01) |
| *H01M 4/42* | (2006.01) |

(Continued)

(52) U.S. Cl.
CPC ............. *H01M 2/30* (2013.01); *Y10T 29/4913* (2015.01); *H05K 1/16* (2013.01); *H05K 2201/10037* (2013.01); *H01M 4/42* (2013.01); *H01M 6/005* (2013.01); *H01M 6/12* (2013.01)

(58) Field of Classification Search
USPC .......... 29/602.1, 623.1–623.4, 831, 832, 854, 29/886; 429/162, 163, 185, 217, 224, 245, 429/246; 242/365.3, 365.6, 365.8, 366, 242/328, 329, 166
See application file for complete search history.

(56) References Cited

U.S. PATENT DOCUMENTS

| | | |
|---|---|---|
| 629,325 A | 7/1899 | Ashley |
| 629,372 A | 7/1899 | Kennedy |

(Continued)

FOREIGN PATENT DOCUMENTS

| | | |
|---|---|---|
| DE | 19943961 A1 | 6/2000 |
| EP | 0678927 A1 | 10/1995 |

(Continued)

OTHER PUBLICATIONS

International Search Report and Written Opinion issued Mar. 29, 2013 in corresponding PCT Application No. PCT/US2012/056899.

(Continued)

*Primary Examiner* — Paul D Kim
(74) *Attorney, Agent, or Firm* — Pearne & Gordon LLP

(57) ABSTRACT

A method of manufacturing an electrical device comprises the steps of providing a substrate, providing an electrical component on the substrate, providing a first electrical contact on the substrate that is electrically connected to the electrical component, and providing an electrochemical cell on or integrating the substrate for providing electrical energy to said electrical component. The electrochemical cell comprises at least one electrochemical layer comprising a cured or dried ink and a first electrode contact electrically connected to said at least one electrochemical layer. The method further includes the step of securing the electrochemical cell to the substrate through an electrically conductive connection that provides both a structural connection and an electrical connection between the first electrical contact and the first electrode contact.

23 Claims, 11 Drawing Sheets

(51) Int. Cl.
  *H01M 6/12*  (2006.01)
  *H05K 1/16*  (2006.01)
  *H01M 6/00*  (2006.01)

(56) References Cited

U.S. PATENT DOCUMENTS

| | | | |
|---|---|---|---|
| 2,154,312 A | 4/1939 | Maccallum | |
| 2,480,531 A | 8/1949 | Wilke | |
| 2,637,757 A | 5/1953 | Wilke | |
| 2,688,649 A | 9/1954 | Bjorksten | |
| 2,903,498 A | 9/1959 | Sindel et al. | |
| 2,905,738 A | 9/1959 | Di Pasquale et al. | |
| 3,006,980 A | 10/1961 | Story | |
| 3,230,115 A | 1/1966 | Tamminen | |
| 3,355,545 A | 11/1967 | Kilduff et al. | |
| 3,375,136 A | 3/1968 | Biggar | |
| 3,655,449 A | 4/1972 | Yamamoto et al. | |
| 3,673,357 A | 6/1972 | Molchan | |
| 3,705,047 A | 12/1972 | Marriott | |
| 3,770,504 A | 11/1973 | Bergum | |
| 3,799,808 A | 3/1974 | Hancock | |
| 3,847,669 A | 11/1974 | Paterniti | |
| 3,901,732 A | 8/1975 | Kalnoki Kis et al. | |
| 3,928,077 A | 12/1975 | Sperandio et al. | |
| 3,954,506 A | 5/1976 | Sullivan | |
| 3,967,292 A | 6/1976 | Delahunt | |
| 3,980,497 A | 9/1976 | Gillman et al. | |
| 3,988,168 A | 10/1976 | Bruneau | |
| 3,993,508 A | 11/1976 | Erlichman | |
| 4,001,467 A | 1/1977 | Sullivan | |
| 4,006,036 A | 2/1977 | Charkoudian | |
| 4,007,472 A | 2/1977 | Land | |
| 4,028,479 A | 6/1977 | Fanciullo et al. | |
| 4,042,760 A | 8/1977 | Land | |
| 4,047,289 A | 9/1977 | Wolff | |
| 4,060,669 A | 11/1977 | Fanciullo | |
| 4,070,528 A | 1/1978 | Bergum et al. | |
| 4,080,728 A | 3/1978 | Buckler | |
| 4,086,399 A | 4/1978 | Hyland et al. | |
| 4,086,400 A | 4/1978 | Hyland et al. | |
| 4,098,965 A | 7/1978 | Kinsman | |
| 4,105,815 A | 8/1978 | Buckler | |
| 4,105,831 A | 8/1978 | Plasse | |
| 4,112,205 A | 9/1978 | Charkoudian et al. | |
| 4,118,860 A | 10/1978 | Buckler et al. | |
| 4,119,770 A | 10/1978 | Land | |
| 4,124,742 A | 11/1978 | Land et al. | |
| 4,125,684 A | 11/1978 | Land | |
| 4,125,685 A | 11/1978 | Bloom et al. | |
| 4,125,686 A | 11/1978 | Kinsman | |
| 4,136,236 A | 1/1979 | Ruetschi | |
| 4,137,627 A | 2/1979 | Kinsman | |
| 4,145,485 A | 3/1979 | Kinsman | |
| 4,150,200 A | 4/1979 | Sullivan | |
| 4,152,825 A | 5/1979 | Bruneau | |
| 4,172,184 A | 10/1979 | Bloom et al. | |
| 4,172,319 A | 10/1979 | Bloom et al. | |
| 4,175,052 A | 11/1979 | Norteman, Jr. | |
| 4,177,330 A | 12/1979 | Gordon et al. | |
| 4,177,552 A | 12/1979 | Gordon et al. | |
| 4,181,778 A | 1/1980 | Land | |
| 4,185,144 A | 1/1980 | Ames et al. | |
| 4,194,061 A | 3/1980 | Land et al. | |
| 4,195,121 A | 3/1980 | Peterson | |
| 4,204,036 A | 5/1980 | Cohen et al. | |
| 4,232,099 A | 11/1980 | Sullivan | |
| 4,242,424 A | 12/1980 | Buckler et al. | |
| 4,254,191 A | 3/1981 | Kniazzeh | |
| 4,256,813 A | 3/1981 | Kniazzeh | |
| 4,287,274 A | 9/1981 | Ibbotson et al. | |
| 4,345,954 A | 8/1982 | Panchu | |
| 4,361,633 A | 11/1982 | Nel et al. | |
| 4,389,470 A | 6/1983 | Plasse | |
| 4,400,452 A | 8/1983 | Bruder | |
| 4,427,748 A | 1/1984 | Land | |
| 4,429,026 A | 1/1984 | Bruder | |
| 4,455,358 A | 6/1984 | Graham et al. | |
| 4,466,470 A | 8/1984 | Bruder | |
| 4,477,544 A | 10/1984 | Bruder | |
| 4,483,576 A * | 11/1984 | Bonhomme | 439/63 |
| 4,502,903 A | 3/1985 | Bruder | |
| 4,505,996 A | 3/1985 | Simonton | |
| 4,525,439 A | 6/1985 | Simonton | |
| 4,532,193 A | 7/1985 | Kniazzeh et al. | |
| 4,539,275 A | 9/1985 | Plasse | |
| 4,554,226 A | 11/1985 | Simonton | |
| 4,604,334 A | 8/1986 | Tarascon | |
| 4,608,279 A | 8/1986 | Schumm, Jr. | |
| 4,609,597 A | 9/1986 | Plasse | |
| 4,621,035 A | 11/1986 | Bruder | |
| 4,623,598 A | 11/1986 | Waki et al. | |
| 4,664,993 A | 5/1987 | Sturgis et al. | |
| 4,683,652 A | 8/1987 | Hatfield | |
| 4,756,717 A | 7/1988 | Sturgis et al. | |
| 4,889,777 A | 12/1989 | Akuto | |
| 4,916,035 A | 4/1990 | Yamashita et al. | |
| 4,977,046 A | 12/1990 | Bleszinski, Jr. et al. | |
| 4,997,732 A | 3/1991 | Austin et al. | |
| 5,035,965 A * | 7/1991 | Sangyoji et al. | 429/124 |
| 5,055,968 A | 10/1991 | Nishi et al. | |
| 5,110,696 A | 5/1992 | Shokoohi et al. | |
| 5,116,701 A | 5/1992 | Kalisz | |
| 5,120,785 A | 6/1992 | Walker et al. | |
| 5,217,828 A | 6/1993 | Sangyoji et al. | |
| 5,259,891 A | 11/1993 | Matsuyama et al. | |
| 5,326,652 A | 7/1994 | Lake | |
| 5,330,860 A | 7/1994 | Grot et al. | |
| 5,338,625 A | 8/1994 | Bates et al. | |
| 5,350,645 A | 9/1994 | Lake et al. | |
| 5,401,590 A | 3/1995 | Chalilpoyil et al. | |
| 5,415,888 A | 5/1995 | Banerjee et al. | |
| 5,424,151 A | 6/1995 | Koksbang et al. | |
| 5,445,856 A | 8/1995 | Chaloner-Gill | |
| 5,455,127 A | 10/1995 | Olsen et al. | |
| 5,470,357 A | 11/1995 | Schmutz et al. | |
| 5,514,492 A | 5/1996 | Marincic et al. | |
| 5,547,911 A | 8/1996 | Grot | |
| 5,565,143 A | 10/1996 | Chan | |
| 5,578,390 A | 11/1996 | Hughen | |
| 5,587,254 A | 12/1996 | Kojima et al. | |
| 5,620,580 A | 4/1997 | Okabe et al. | |
| 5,622,652 A | 4/1997 | Kucherovsky et al. | |
| 5,624,468 A | 4/1997 | Lake | |
| 5,637,418 A | 6/1997 | Brown et al. | |
| 5,652,043 A | 7/1997 | Nitzan | |
| 5,658,684 A | 8/1997 | Lake | |
| 5,728,181 A | 3/1998 | Jung et al. | |
| 5,735,912 A | 4/1998 | Lake | |
| 5,735,914 A | 4/1998 | Lake | |
| 5,747,190 A | 5/1998 | Lake | |
| 5,747,191 A | 5/1998 | Lake | |
| 5,759,215 A | 6/1998 | Masuda | |
| 5,779,839 A | 7/1998 | Tuttle et al. | |
| 5,811,204 A | 9/1998 | Nitzan | |
| 5,834,321 A | 11/1998 | Salisbury | |
| 5,865,859 A | 2/1999 | Lake | |
| 5,897,522 A | 4/1999 | Nitzan | |
| 5,906,661 A | 5/1999 | Lake | |
| 5,930,023 A | 7/1999 | Mitchell, Jr. et al. | |
| 5,941,844 A | 8/1999 | Eckenhoff | |
| 6,015,520 A | 1/2000 | Appelt et al. | |
| 6,025,089 A | 2/2000 | Lake | |
| 6,030,423 A | 2/2000 | Lake | |
| 6,030,721 A | 2/2000 | Lake | |
| 6,045,942 A | 4/2000 | Miekka et al. | |
| 6,078,842 A | 6/2000 | Gross et al. | |
| 6,084,380 A | 7/2000 | Burton | |
| RE36,843 E | 8/2000 | Lake et al. | |
| 6,136,468 A | 10/2000 | Mitchell, Jr. et al. | |
| 6,157,858 A | 12/2000 | Gross et al. | |
| 6,184,794 B1 | 2/2001 | Tucholski | |
| 6,186,982 B1 | 2/2001 | Gross et al. | |
| 6,187,475 B1 | 2/2001 | Oh et al. | |
| 6,200,704 B1 | 3/2001 | Katz et al. | |

(56) References Cited

U.S. PATENT DOCUMENTS

| | | |
|---|---|---|
| 6,208,524 B1 | 3/2001 | Tuttle |
| 6,235,422 B1 | 5/2001 | Kaplan et al. |
| 6,243,192 B1 | 6/2001 | Mitchell, Jr. et al. |
| 6,273,904 B1 | 8/2001 | Chen et al. |
| 6,277,520 B1 | 8/2001 | Moutsios et al. |
| 6,317,630 B1 | 11/2001 | Gross et al. |
| 6,369,793 B1 | 4/2002 | Parker |
| 6,379,835 B1 | 4/2002 | Kucherovsky et al. |
| 6,395,043 B1 | 5/2002 | Shadle et al. |
| 6,421,561 B1 | 7/2002 | Morris |
| 6,458,234 B1 | 10/2002 | Lake et al. |
| 6,503,658 B1 | 1/2003 | Klein et al. |
| 6,503,831 B2 | 1/2003 | Speakman |
| 6,541,712 B1 | 4/2003 | Gately et al. |
| 6,569,572 B1 | 5/2003 | Ochiai et al. |
| 6,576,364 B1 | 6/2003 | Mitchell, Jr. et al. |
| 6,643,532 B2 | 11/2003 | Axelgaard |
| 6,653,014 B2 | 11/2003 | Anderson et al. |
| 6,664,006 B1 | 12/2003 | Munshi |
| 6,676,021 B1 | 1/2004 | Luski et al. |
| 6,676,714 B2 | 1/2004 | Langan |
| 6,697,694 B2 | 2/2004 | Mogensen |
| 6,708,050 B2 | 3/2004 | Carim |
| 6,709,778 B2 | 3/2004 | Johnson |
| 6,729,025 B2 | 5/2004 | Farrell et al. |
| 6,740,451 B2 | 5/2004 | Christian et al. |
| 6,743,546 B1 | 6/2004 | Kaneda et al. |
| 6,747,217 B1 | 6/2004 | Jochym et al. |
| 6,752,842 B2 | 6/2004 | Luski et al. |
| 6,757,560 B1 | 6/2004 | Fischer et al. |
| 6,799,721 B2 | 10/2004 | Parrault |
| 6,816,125 B2 | 11/2004 | Kuhns et al. |
| 6,825,829 B1 | 11/2004 | Albert et al. |
| 6,836,215 B1 | 12/2004 | Laurash et al. |
| 6,838,209 B2 | 1/2005 | Langan et al. |
| 6,855,441 B1 | 2/2005 | Levanon |
| 6,884,546 B1 | 4/2005 | Fujita et al. |
| 6,888,502 B2 | 5/2005 | Beigel et al. |
| 6,899,976 B2 | 5/2005 | Larson et al. |
| 6,915,159 B1 | 7/2005 | Kuribayashi et al. |
| 7,009,519 B2 | 3/2006 | Leonard et al. |
| 7,017,822 B2 | 3/2006 | Aisenbrey |
| 7,022,431 B2 | 4/2006 | Shchori et al. |
| 7,031,768 B2 | 4/2006 | Anderson et al. |
| 7,043,297 B2 | 5/2006 | Keusch et al. |
| 7,049,962 B2 | 5/2006 | Atherton et al. |
| 7,164,384 B2 | 1/2007 | Howard |
| 7,224,280 B2 | 5/2007 | Ferguson et al. |
| RE39,676 E | 6/2007 | Nitzan |
| 7,233,250 B2 | 6/2007 | Forster |
| 7,238,196 B2 | 7/2007 | Wibaux |
| 7,244,326 B2 | 7/2007 | Craig et al. |
| 7,294,209 B2 | 11/2007 | Shakespeare |
| 7,320,845 B2 | 1/2008 | Zucker |
| 7,335,441 B2 | 2/2008 | Luski et al. |
| 7,340,297 B2 | 3/2008 | Tamarkin et al. |
| 7,340,310 B2 | 3/2008 | Nitzan et al. |
| 7,347,382 B2 | 3/2008 | Ferber et al. |
| 7,348,096 B2 * | 3/2008 | Schubert et al. ............. 429/127 |
| 7,364,896 B2 | 4/2008 | Schembri |
| 7,368,191 B2 | 5/2008 | Andelman et al. |
| 7,383,083 B2 | 6/2008 | Fischer et al. |
| 7,394,382 B2 | 7/2008 | Nitzan et al. |
| 7,461,613 B2 | 12/2008 | Sinclair et al. |
| 7,483,738 B2 | 1/2009 | Tamarkin et al. |
| 7,491,465 B2 | 2/2009 | Nitzan et al. |
| 7,501,208 B2 | 3/2009 | Feddrix et al. |
| 7,504,952 B2 | 3/2009 | Kaplan et al. |
| 7,599,192 B2 | 10/2009 | Pennaz et al. |
| 7,603,144 B2 | 10/2009 | Jenson et al. |
| 7,625,664 B2 | 12/2009 | Schubert et al. |
| 7,643,874 B2 | 1/2010 | Nitzan et al. |
| 7,652,188 B2 | 1/2010 | Levanon et al. |
| 7,724,550 B2 | 5/2010 | Bohm et al. |
| 7,727,290 B2 * | 6/2010 | Zhang et al. ............. 29/623.5 |
| 7,884,720 B2 | 2/2011 | Nitzan et al. |
| 8,119,278 B2 * | 2/2012 | Bailey et al. ............. 429/162 |
| 8,268,475 B2 * | 9/2012 | Tucholski ............. 429/162 |
| 8,722,235 B2 * | 5/2014 | Tucholski et al. ............. 429/176 |
| 2002/0086215 A1 | 7/2002 | Tamura et al. |
| 2002/0095780 A1 | 7/2002 | Shadle et al. |
| 2002/0110733 A1 | 8/2002 | Johnson |
| 2002/0182485 A1 | 12/2002 | Anderson et al. |
| 2002/0192542 A1 | 12/2002 | Luski et al. |
| 2003/0014014 A1 | 1/2003 | Nitzan |
| 2003/0059673 A1 | 3/2003 | Langan et al. |
| 2003/0082437 A1 | 5/2003 | Sotomura |
| 2003/0130015 A1 | 7/2003 | McTaggart |
| 2003/0165744 A1 * | 9/2003 | Schubert et al. ............. 429/303 |
| 2003/0187338 A1 | 10/2003 | Say et al. |
| 2003/0219648 A1 | 11/2003 | Zucker |
| 2003/0232248 A1 | 12/2003 | Iwamoto et al. |
| 2004/0001998 A1 | 1/2004 | Hopkins et al. |
| 2004/0009398 A1 | 1/2004 | Dorfman |
| 2004/0018422 A1 | 1/2004 | Islam et al. |
| 2004/0170893 A1 | 9/2004 | Nakaishi et al. |
| 2004/0209160 A1 | 10/2004 | Luski et al. |
| 2004/0217865 A1 | 11/2004 | Turner |
| 2004/0267189 A1 | 12/2004 | Mavor et al. |
| 2004/0267190 A1 | 12/2004 | Tamarkin et al. |
| 2004/0267283 A1 | 12/2004 | Mavor et al. |
| 2005/0013783 A1 | 1/2005 | Perricone |
| 2005/0038473 A1 | 2/2005 | Tamarkin et al. |
| 2005/0085751 A1 | 4/2005 | Daskal et al. |
| 2005/0147880 A1 | 7/2005 | Takahashi et al. |
| 2005/0194454 A1 | 9/2005 | Ferber et al. |
| 2005/0260492 A1 | 11/2005 | Tucholski et al. |
| 2006/0001528 A1 | 1/2006 | Nitzan et al. |
| 2006/0007049 A1 | 1/2006 | Nitzan et al. |
| 2006/0012464 A1 | 1/2006 | Nitzan et al. |
| 2006/0087432 A1 | 4/2006 | Corbett, Jr. |
| 2006/0131616 A1 | 6/2006 | Devaney et al. |
| 2006/0146271 A1 | 7/2006 | Pennaz et al. |
| 2006/0159899 A1 | 7/2006 | Edwards et al. |
| 2006/0211936 A1 | 9/2006 | Hu et al. |
| 2006/0216586 A1 | 9/2006 | Tucholski |
| 2006/0222935 A1 | 10/2006 | Takahashi et al. |
| 2006/0227669 A1 | 10/2006 | Pennaz et al. |
| 2006/0253061 A1 | 11/2006 | Anderson et al. |
| 2006/0264804 A1 | 11/2006 | Karmon et al. |
| 2007/0007661 A1 | 1/2007 | Burgess et al. |
| 2007/0011870 A1 | 1/2007 | Lerch et al. |
| 2007/0016277 A1 | 1/2007 | Karat et al. |
| 2007/0024425 A1 | 2/2007 | Nitzan et al. |
| 2007/0060862 A1 | 3/2007 | Sun et al. |
| 2007/0066930 A1 | 3/2007 | Tanioka et al. |
| 2007/0196718 A1 | 8/2007 | Leistra et al. |
| 2007/0211398 A1 | 9/2007 | Whitney |
| 2007/0243459 A1 | 10/2007 | Jenson et al. |
| 2007/0290051 A1 | 12/2007 | Bielmann et al. |
| 2008/0004564 A1 | 1/2008 | Smith |
| 2008/0007409 A1 | 1/2008 | Ferry et al. |
| 2008/0021436 A1 | 1/2008 | Wolpert et al. |
| 2008/0035736 A1 | 2/2008 | Tompkin et al. |
| 2008/0035740 A1 | 2/2008 | Tanner |
| 2008/0041822 A1 | 2/2008 | Wang |
| 2008/0091095 A1 | 4/2008 | Heller et al. |
| 2008/0154178 A1 | 6/2008 | Carter et al. |
| 2008/0174380 A1 | 7/2008 | Nitzan et al. |
| 2008/0218345 A1 | 9/2008 | Nitzan et al. |
| 2008/0239644 A1 | 10/2008 | Cassidy et al. |
| 2008/0248382 A1 * | 10/2008 | Sastry et al. ............. 429/129 |
| 2008/0272890 A1 | 11/2008 | Nitzan et al. |
| 2009/0038746 A1 | 2/2009 | Tucholski |
| 2009/0136832 A1 | 5/2009 | Mitsuda et al. |
| 2009/0161194 A1 | 6/2009 | Pennaz |
| 2009/0230197 A1 | 9/2009 | Tanner |
| 2010/0072271 A1 | 3/2010 | Thorstensson |
| 2010/0196744 A1 | 8/2010 | Tucholski et al. |
| 2010/0209756 A1 | 8/2010 | Bailey et al. |

(56) References Cited

U.S. PATENT DOCUMENTS

| | | |
|---|---|---|
| 2010/0266895 A1 | 10/2010 | Tucholski |
| 2011/0241446 A1 | 10/2011 | Tucholski |

FOREIGN PATENT DOCUMENTS

| | | |
|---|---|---|
| EP | 0862227 A1 | 9/1998 |
| EP | 1026767 A1 | 8/2000 |
| EP | 1096589 A1 | 5/2001 |
| EP | 1107336 A2 | 6/2001 |
| EP | 2003940 A2 | 12/2008 |
| JP | 55-133770 A | 10/1980 |
| JP | 58-206048 A | 12/1983 |
| JP | 59-228353 A | 12/1984 |
| JP | 61-55866 A | 3/1986 |
| JP | 61-64077 A | 4/1986 |
| JP | 62-126557 A | 6/1987 |
| JP | 62-165875 A | 7/1987 |
| JP | 62-165876 A | 7/1987 |
| JP | 62-285954 A | 12/1987 |
| JP | 63-81762 A | 4/1988 |
| JP | 63-119155 A | 5/1988 |
| JP | 64-24364 A | 1/1989 |
| JP | 2-273464 A | 11/1990 |
| JP | 4-276665 A | 10/1992 |
| JP | 5-217587 A | 8/1993 |
| JP | 5-225989 A | 9/1993 |
| JP | 5-275087 A | 10/1993 |
| JP | 2000-164033 A | 6/2000 |
| JP | 2000-229128 A | 8/2000 |
| JP | 2000-319381 A | 11/2000 |
| JP | 2001-23695 A | 1/2001 |
| JP | 2001-521676 A | 11/2001 |
| JP | 2003-151634 A | 5/2003 |
| JP | 2003-282148 A | 10/2003 |
| JP | 2004-336240 A | 11/2004 |
| JP | 2005-39256 A | 2/2005 |
| TW | 540185 B | 7/2003 |
| WO | 90/13096 A1 | 11/1990 |
| WO | 96/38867 A1 | 12/1996 |
| WO | 97/17735 A1 | 5/1997 |
| WO | 98/22987 A2 | 5/1998 |
| WO | 98/48469 A1 | 10/1998 |
| WO | 00/36672 A1 | 6/2000 |
| WO | 03/069700 A2 | 8/2003 |
| WO | 2006/003648 A2 | 1/2006 |
| WO | 2009/018315 A2 | 2/2009 |

OTHER PUBLICATIONS

Acheson Colloids Company, "Sales Information Bulletin," Port Huron, MI.
Acheson Industries, "Acheson Electrical Materials," from www.achesonindustries.com, dated Nov. 24, 2009.
Advanced Coatings and Chemicals, "Technical Data Sheet," Temple City, CA.
Hartman, Lauren R., "Flexibles stay resilient," Packaging Digest, Mar. 1, 2005.
Linden, D., Handbook of Batteries and Fuel Cells, pp. 5.5-5.7, McGraw-Hill, Inc., 1984.
Linden, D., Handbook of Batteries, Second Edition, pp. 8.8-8.9, McGraw-Hill, Inc., 1995.
Omnexus Adhesives & Sealant Solutions, "Ethylene Vinyl Acetate (EVA) and Other Hot Melts," from http://www.omnexus4adhesives.com/bc/construction-channel/index.aspx?id=ethylene.

* cited by examiner

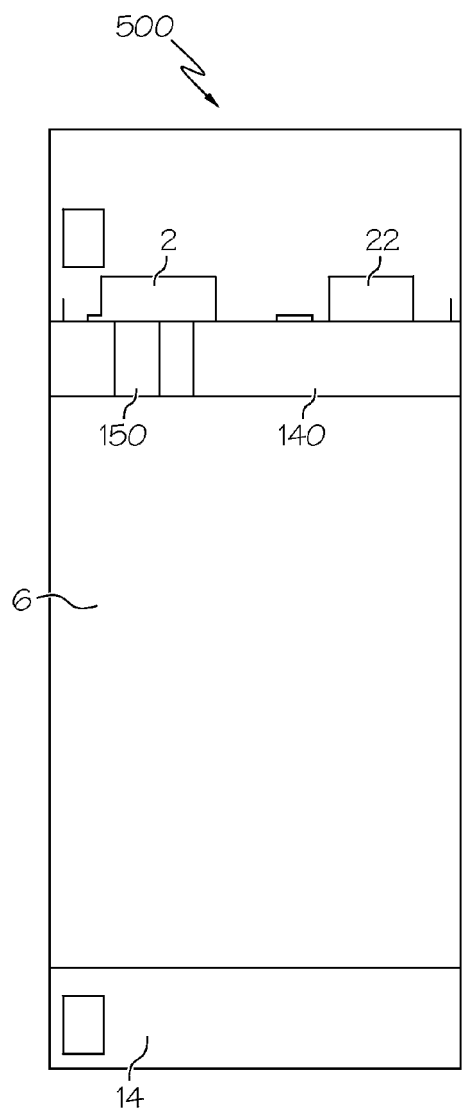
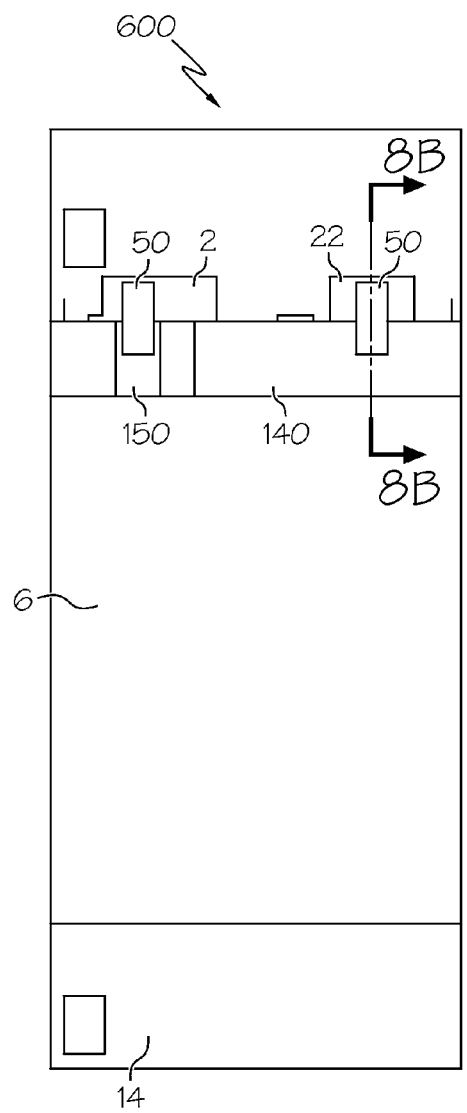
FIG. 7
FIG. 8

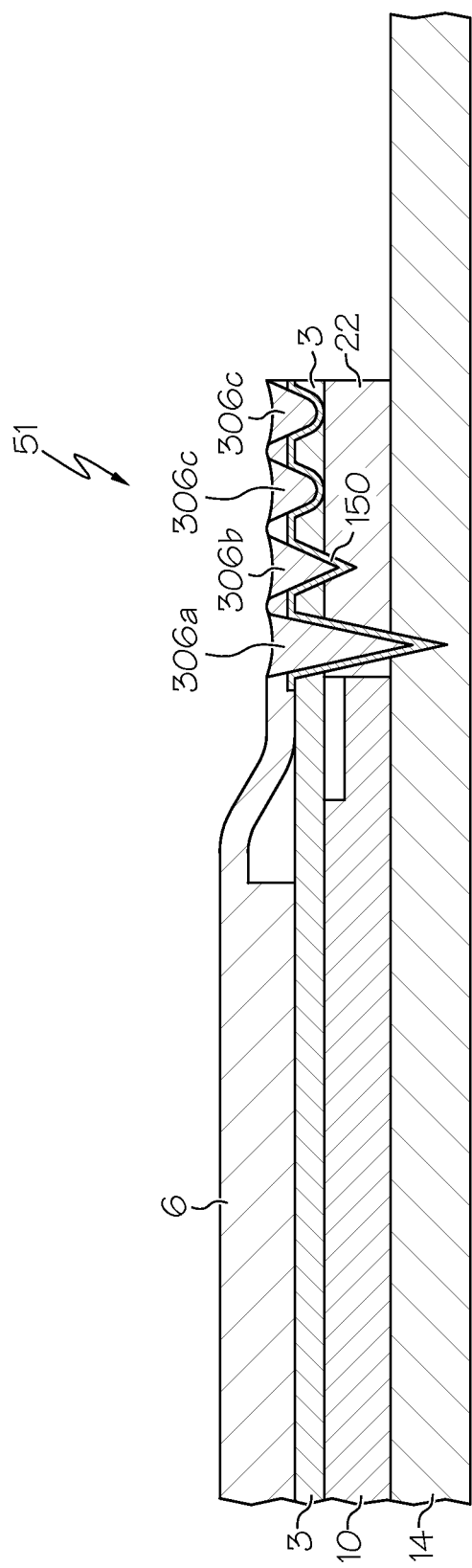

CELL ATTACHMENT METHOD

CROSS-REFERENCE TO RELATED APPLICATIONS

This application claims the benefit of U.S. provisional application Ser. No. 61/537,706, filed on Sep. 22, 2011, which is incorporated herein in its entirety by reference thereto.

BACKGROUND OF THE INVENTION

For the past one hundred years or so, scientists have been making Carbon/Zinc portable power sources for various applications. In the early days of portable power, these power sources were very large compared to today's standards. For example, the very popular "Igniter Cell" made by Eveready was about 3" diameter and about 9" tall and was used in many applications such as radios, buzzers, Xmas lighting, etc. These large cells, as well as some smaller versions, such as the famous Eveready #6 (about 2" dia.×6" tall) and the smallest unit cell of the day, the #950 (D size), were commonly made into battery packs with voltages exceeding 40 volts in some applications. These were similar in size, and even larger, than today's car batteries, for uses in lighting devices, radios and car ignition systems. In the mid 1900's, with the advent of advanced electronics such as the transistor, the electrical requirements for portable power sources were drastically reduced. Consequently, cell sizes could also be reduced to include C's, AA's, and AAA's, and even small button cells. This power reduction has continued into the twenty-first century, where applications such as smart labels, smart credit cards, sensors, data loggers, novelty devices such as greeting cards and badges, etc., now require a maximum current of several milliamperes, with many applications requiring as little as a few microamperes at about 1.5-3.0 volts. These applications also have the requirement that the power sources be flat and very thin to maintain their low profiles and portability.

In the past twenty-five years, various approaches for making thin, flat cells and batteries were attempted by numerous scientists and corporations. These include the widely known instant film battery pack developed by Polaroid. This battery pack was used in each package of Polaroid instant film. This allowed Polaroid to have a fresh battery in the camera each time the user placed a new pack of film in the camera. This high cost battery with multiple layers and a metal foil laminate package is a high voltage, high current battery, capable of igniting flash bulbs and powering motors, for example, and is not a realistic competitor of the new thin low cost batteries that are needed. In addition to Polaroid, others have tried to develop thin batteries in various electrochemical systems.

Co-pending U.S. application Ser. No. 11/110,202 filed on Apr. 20, 2005 and Ser. No. 12/809,844 filed on Jun. 21, 2010 and U.S. Pat. No. 8,029,927 incorporated herein by reference, discuss new designs and methods of manufacture of a flat cell and battery.

With the growing market needs for low cost, low capacity thin flat cells, it would be beneficial to produce a thin, flat, printable flexible cell that is versatile and inexpensive to mass-produce. Printable, disposable thin cells that are well suited for low-power and high-production volume applications would be useful, especially if they offer adequate voltage, sufficient capacity, and low-cost solutions. Conventional low-profile batteries typically have few of these attributes, if any. Still, it is possible to utilize a low-profile battery (i.e., a coin cell or button cell), or any other type of battery, in the instant electrical device.

There are many electrical devices that are powered with batteries. Examples can include RFID (radio frequency identification) devices, sensors, interactive media, interactive packaging, dermal patches, and numerous other applications. In recent years, as described in several patent applications by the same applicant, providing electronics on flexible substrates, such as by printing, etching, etc., has become a new process and growing in popularity. In one example process, the circuit is printed as well as some of the electronic components. In some applications, the power source could also be printed in a totally integrated manner. However, in some other applications where economic considerations and/or technical or compatibility considerations makes it less desirable to print the power source on the circuit, the power source could be integrated in a different manner. Various unique methods are described herein.

SUMMARY OF THE INVENTION

The following presents a simplified summary of the invention in order to provide a basic understanding of some aspects of the invention. This summary is not an extensive overview of the invention. It is intended to identify neither key nor critical elements of the invention nor delineate the scope of the invention. Its sole purpose is to present some concepts of the invention in a simplified form as a prelude to the more detailed description that is presented later.

In accordance with one aspect of the present invention, a method of manufacturing an electrical device comprises the steps of providing a substrate and providing an electrical component on the substrate. The method further includes the steps of providing a first electrical contact on the substrate that is electrically connected to the electrical component, and providing an electrochemical cell on or integrating the substrate for providing electrical energy to said electrical component. The electrochemical cell comprises at least one electrochemical layer comprising a cured or dried ink and a first electrode contact electrically connected to said at least one electrochemical layer. The method further includes the step of securing the electrochemical cell to the substrate through an electrically conductive connection that provides both a structural connection and an electrical connection between the first electrical contact and the first electrode contact.

In accordance with another aspect of the present invention, a method of manufacturing an electrical device comprises the steps of providing a substrate and providing an electrical component on the substrate. The method further includes the steps of providing a first electrical contact on the substrate that is electrically connected to the electrical component, and providing an electrochemical cell on or integrating the substrate for providing electrical energy to said electrical component. The electrochemical cell comprises at least one electrochemical layer comprising a cured or dried ink and a first electrode contact electrically connected to said at least one electrochemical layer. The method further includes the steps of arranging the first electrode contact over the first electrical contact, and perforating the first electrode contact such that at least a portion of the first electrode contact is both structurally connected and electrically connected to the first electrical contact.

BRIEF DESCRIPTION OF THE DRAWINGS

The foregoing and other features and advantages of the present invention will become apparent to those skilled in the art to which the present invention relates upon reading the following description with reference to the accompanying drawings, in which:

FIG. 7 is similar to FIG. 5, but illustrates an example flat battery coupled to the electrical component;

FIG. 8 is similar to FIG. 5, but illustrates an example conductive adhesive on an electrical contact;

FIG. 11B is another sectional view through line 11B-11B of FIG. 11;

DETAILED DESCRIPTION OF THE PREFERRED EMBODIMENTS OF THE INVENTION

Figure 1:
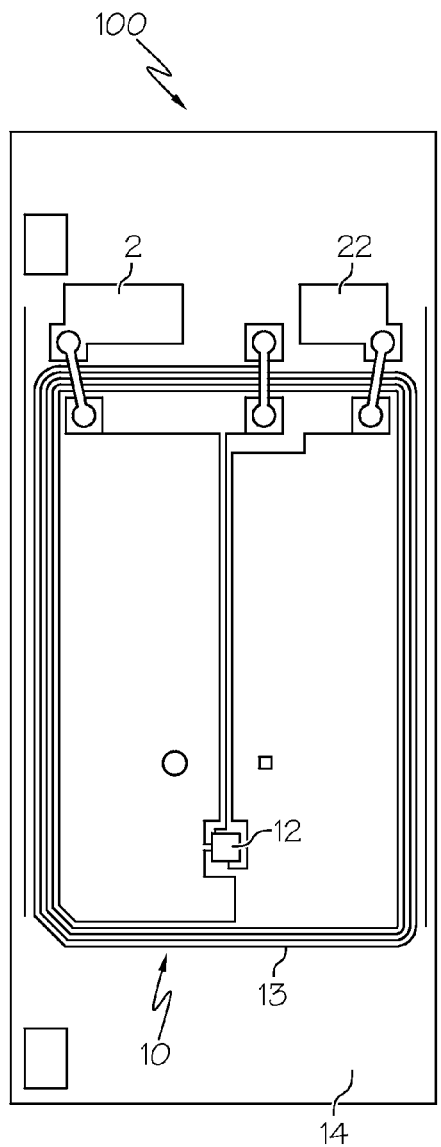
FIG. 1 illustrates a top view of an example electrical device comprising an electrical component.

Various electrical devices are powered with batteries, such as RFID (radio frequency identification) devices, sensors, interactive media, interactive packaging, dermal patches, and numerous other applications. For example, a typical RFID device could include a display, IC chip, sensor, antennae (e.g., RFID antenna), and a low capacity power source such as a flat printed battery or low-profile battery.

As shown in the Figures to provide greater clarity, one or more of the elements may be shown as a substantially transparent layer so that the various elements covered thereby can be seen, though it is understood that any of the elements can also be translucent or opaque. Herein, the battery is generally described as a flat battery. However, it is understood that it is possible to utilize a low-profile battery (i.e., a coin cell, button cell, or the like), or any other type of power supply (including RFID wireless power supply), in the described electrical devices.

Various methods can be used to manufacture flat batteries. In one example, the electrochemical cells (i.e., batteries) are typically printed and/or laminated on a continuous, flexible substrate web, and may be formed into a roll or the like. The individual batteries can be removed from the roll, such as one at a time. For example, the batteries can be cut from the roll, and/or perforations of the flexible substrate roll can be provided for easy tear off. In addition, the batteries can further be manufactured in an integrated process with one or more electrical components, such as an antenna, display, and/or a processor, for example. The multiple facets of this application could be used in the total package described and/or they could be used individually or in any combination.

As used herein, unless otherwise explicitly indicated, all percentages are percentages by weight. Also, as used herein, when a range such as "5-25" (or "about 5-25") is given, this means, for at least one embodiment, at least about 5 and, separately and independently, not more than about 25, and unless otherwise indicated, ranges are not to be strictly construed, but are given as acceptable examples. Also herein, a parenthetical range following a listed or preferred value indicates a broader range for that value according to additional embodiments of the application.

The present application relates to thin, printed electrochemical cells and/or batteries comprising a plurality of such cells. Such cells each typically include at least a first electrode including a first electrochemical layer (e.g., a cathode), a second electrode including a second electrochemical layer (e.g., an anode), and an electrolyte that interacts with the electrodes to create an electrical current. All of the first and second electrodes and the electrolyte are typically contained within some structure which provides an external electrical access to the electrodes for providing an electrical current supply to some device.

One method of mass-producing such cells includes depositing aqueous and/or non-aqueous solvent inks and/or other coatings in a pattern on a special substrate, such as a laminated polymeric film layer, for example. The depositing can be by means of, for example, printing electrochemical inks and/or laminating a metallic foil, such as zinc foil, for example, on one or more high-speed web rotary screen printing presses, especially if the desired volumes are very high. If volumes are relatively lower, say in the quantities of only about several million or less, then relatively slower methods such as web printing with flat bed screens could be appropriate. If the volumes are even lower, such as hundreds or thousands, then a sheet-fed flat bed printing press may be utilized, for example. Still, various printing methods can be used for various desired quantities.

After the inks are printed and/or the solids have been properly placed, the cells can be completed (e.g., sealed, die cut, stacked and/or perforated and wound into a roll, or stacked if sheets are used on a printing press). This cell manufacturing process can also be utilized for integrating one or more individual cells with an actual electronic application, or into batteries comprising multiple cells connected in series or parallel, or some combination of the two. Examples of such devices and corresponding processes will be described later, but many additional embodiments are also contemplated.

As discussed above, the battery may be described as a printed, flexible, and thin electrochemical cell. Such a cell can include, for example, a lower film substrate that can utilize a special polymer laminate that has special features, possibly including, for example, a high moisture barrier layer in the center that is surrounded by polymer films on both sides. Furthermore, one or both outside surfaces can be made to be print receptive for printing information, logos, instructions, identifications, serial numbers, graphics, or other information or images, as desired.

Depending on which construction of this battery is used, the inner ply of the substrate could also feature a heat-sealing layer that might be co-extruded on the side opposite the barrier coating. In addition or alternatively, one or more of the substrate layers can comprise a polymeric film and an oxide barrier layer having a gas transmission rate that permits gas to escape. For example, depending on the cell construction, the cell application, and/or the cell environment, it may be advantageous to have different barrier properties for the substrate. Due to the wide range of available vapor transmission rates available, the barrier layer can be chosen for each specific application and construction, as desired. In some cases, for example where the cell by design has a higher gassing rate, it may be appropriate and desirable to use a film with a higher transmission rate to allow for a larger amount of gas to escape, so as to minimize cell bulging. Another example would be an application that is in a hot dry environment such as a desert. In such cases, it may be desirable to have a barrier film with low transmission rates to prevent excessive moisture loss from the cell.

In addition, a portion of the inner surface of a lower substrate layer of a cell of at least some embodiments could utilize an anode and/or a cathode current collector, such as carbon, for example, printed or coated or otherwise applied on a portion of the film substrate. At an outside contact area of these collectors can also be printed a layer of a relatively highly conductive ink, such as carbon, gold, silver, nickel, zinc, or tin, for example, to improve the conductivity to the application connection, if desired. However, if the battery application is used for relatively low current requirements, then the higher conductive layer contact material, or even the current collector, may not be utilized for one or both electrodes.

For at least some embodiments, a water-based ink electrochemical layer is printed as the cathode. Such a cathode layer can include, for example, manganese dioxide ($MnO_2$), carbon, and a polymer binder. Other formulations for the cathode layer can also be utilized with or without any of these materials. If a cathode collector layer is used, which may or may not form a portion of the cathode layer, the cathode electrochemical layer will be printed on at least a portion of the cathode current collector, which is printed or otherwise applied first to the substrate.

Regarding the anode, in an off-line operation, a dry-film adhesive layer, possibly using a release liner, can be applied to the zinc foil. The zinc foil can then be laminated to the base substrate. Additionally, the anode layer could be applied by printing a zinc ink onto the substrate or on top of a collector, such as carbon. Where carbon is used, it could be printed in the same station as the carbon collector used for the cathode.

Optionally, printed over one or both the anode and cathode, is a binder absorber material that can act as an electrolyte absorber to keep the electrodes "wet" after an aqueous electrolyte solution is added to the cell. This absorber material could also include the electrolyte salts and the water used for the cell reaction. In one example, a paper layer over the anode and cathode could be used. Alternatively, although less desirably, a starch ink or other material could be used. In at least one embodiment, the absorber layer with the addition of the aqueous electrolyte could be replaced, for example, by a printable viscous liquid (which could include a gel, or some other viscous material) that effectively covers at least a portion of each electrode. One such printable gel is described in United States Patent Publication 2003/0165744A1, published on Sep. 4, 2003, and incorporated herein by reference. These viscous formulations could, for example, utilize the electrolyte formulas and concentrations previously discussed.

For some embodiments, after the two electrodes are in place, with or without the absorber layer(s), an optional cell "picture frame" can be added. This could be done using a number of different methods. One method is to print this cell picture frame with a dielectric ink, for example. Another method is to utilize a polymer sheet or a laminated polymer sheet that includes adhesive layers, that is stamped, die cut, laser cut or similar methods to form the appropriate "pockets" (inner space or spaces) to house materials of each unit cell as well as to expose the electrical contacts to connect the device.

To ensure good sealing of the picture frame to the substrates, and to provide good sealing of the contact feed-through (providing an electrical pathway from the cell inside to the cell exterior), a sealing or caulking adhesive could be printed over the contact feed-through and the substrate, such as in the same pattern as the cell frame, for example, prior to the frame being printed or prior to the polymer sheets being inserted, for example.

This sealing or caulking material could be pressure sensitive, and/or heat sensitive, for example, such as Acheson Colloids' PM040, for example, or any other type of material that would facilitate sealing to both surfaces.

After the dielectric picture frame is printed and dried and/or cured, a heat sensitive sealing adhesive can be printed on top of the frame to allow good sealing of the top substrate to the cell frame. This cell picture frame could also comprise a polymer film or a laminated film of about 0.015" thick (range of about 0.003"-0.050") that is pre-punched and then laminated in registration to match the preprinted caulking adhesive layer described above.

Zinc chloride ($ZnCl_2$) can be chosen as the electrolyte, for at least some embodiments, in the concentration range of about 18%-45% by weight, for example. In one example, about 27% may be preferred. The electrolyte can be added, for example, to the open cell. To facilitate processing on the line, this electrolyte, or a different electrolyte, could be thickened with, for example, CMC at about a level of about 0.6 wgt % (range of about 0.05%-1.0%).

Other useful electrolyte formulations, such as ammonium chloride ($NH_4Cl$), mixtures of zinc chloride ($ZnCl_2$) and ammonium chloride ($NH_4Cl$), zinc acetate ($Zn(C_2H_3O_2)$), zinc bromide ($ZnBr_2$), zinc fluoride ($ZnF_2$), zinc tartrate ($ZnC_4H_4O_6 \cdot H_2O$), zinc per-chlorate $Zn(ClO_4)_2 \cdot 6H_2O$), potassium hydroxide, sodium hydroxide, or organics, for example, could also be used.

Zinc chloride may be the electrolyte of choice, providing excellent electrical performance for ordinary environmental conditions normally encountered. Likewise, any of the above mentioned alternative electrolytes, among others, could be used in concentrations (by weight), for example, within the range of about 18%-50%, with the range of about 25%-45% used for at least some other embodiments. Such compositions could also provide acceptable performance under ordinary environmental conditions. When zinc acetate is used to achieve improved low temperature performance for low temperature applications, the zinc acetate concentration in the range of about 31-33, is often acceptable, although ranges of about 30-34, about 28-36, about 26-38, and even about 25-40, weight percent, could also be utilized.

The use of electrolytes other than of zinc chloride can provide improved cell/battery electrical performance under some differing environmental conditions. For example, about 32% by weight zinc acetate (F.P.—freezing point—about 28° C.) exhibits a lower freezing point than about 32% by weight zinc chloride (F.P. about −23° C.). Both of these solutions exhibit a lower freezing point than of about 27% zinc chloride (F.P. about −18° C.). Other zinc acetate concentrations, e.g. about 18-45 or about 25-35 weight percent, also exhibit reduced freezing points. Additionally, a thickener, such as carboxymethylcellulose (CMC) can reduce the freezing point. Alternatively, potassium hydroxide (KOH) and/or sodium hydroxide (NaOH) could be used as an electrolyte to provide improved cell/battery electrical performance due to its higher conductivity under some differing environmental conditions. The cell performance could be greatly enhanced due to the much higher conductivity of the KOH electrolyte.

For example, a good working range of KOH would be concentrations (by weight) within the range of about 23%-45%.

Use of such electrolyte formulations as substitutes for zinc chloride, or in various mixtures used in cells, can allow for improved performance at low temperatures. For example, it has been found that the use of an about 32% zinc acetate electrolyte substantially improves low temperature (i.e. below about −20° C.) performance of a voltaic cell. This type of electrochemical cell performance improvement at low temperature can be utilized in the growing business of battery assisted RFID tags, for example, and/or other transient (transportable) electrically operated devices, such as smart active labels and temperature tags, for example, which may be used in cold environments.

For example, many products that are shipped today, such as food products pharmaceuticals, blood, etc, may require low temperature storage and shipping conditions, or even low temperature operation. To ensure safe shipment of such goods, these items can be tracked with RFID tags, sensors, and/or displays. These tags and/or labels might require electrochemical cells and/or batteries to operate effectively at temperatures at, or even below, −20° C., such as at about −23° C., about −27° C., or even at about −30° C. or less.

The upper substrate of a cell package could utilize a special laminated polymeric film, which has an edge that extends beyond the internal cell/battery components onto the cell frame. The upper layer is sealed around the edges of the cell frame by means of a pressure sensitive adhesive (PSA), and/or with the heat sensitive sealing adhesive that was previously extruded by the film manufacturer or printed as part of the battery construction, thus confining the internal components within the cell frame.

The above-described constructions can be wet cell constructions; however, using a similar cell construction, the battery could be also be made into a reserve cell construction, which has the benefit of providing extended shelf life prior to the application of a liquid. The printable, flexible, zinc chloride thin cell is made environmentally friendly.

The devices for which this technology can be used are extensive. Devices that utilize relatively low power or a limited life of one to three years, and possibly longer, could function utilizing a thin cell/battery of the type described herein. The cell, as explained in the above paragraphs and below, can often be inexpensively mass-produced so that it can be used in a disposable product, for example. The low cost allows for applications that previously were not cost effective.

The electrochemical cell/battery according to the application might have one or more of the following advantages:
  Relatively thin;
  Flat, and of relatively uniform thickness, where the edges (except for possibly the contact area) are of about the same thickness as the center;
  Flexible;
  Many geometric shapes are possible;
  Sealed container;
  Simple construction;
  Designed for high speed and high volume production;
  Low cost;
  Reliable performance at many temperatures;
  Good low temperature performance;
  Disposable and environmentally friendly;
  Both cell contacts provided on the same surface;
  Ease of assembly into an application; and
  Capable of being easily integrated in a continuous process at the same time that the electronic application is being made or in an offline process.

The above was a general description of various cell constructions according to some embodiments of this application, and further details utilizing drawings follow below. Cell and battery production processes for cell printing and assembly also will be described as well.

In one example, such as where relatively high speed, high output manufacturing is contemplated, such as 50 linear feet per minute or another relatively high speed, multiple webs can be used. It is to be understood that the multiple webs can be generally continuous, and can be utilized with known web manufacturing equipment. A first web can be relatively thin, such as ~0.001"-0.010" and preferably about 0.003-0.006", flexible base substrate including a multi-ply laminated structure or single ply material. In one example, the multi-ply structure can include five layers. Alternatively, the single ply material can include various materials, such as Kapton, polyolifins or polyester. Additionally, if the 0.001" layer is too thin to handle efficiently on the printing press and/or on other operations, then a thicker low cost throw away support layer with a low tact pressure sensitive adhesive layer could be laminated to the thin substrate layer. Also, this 0.001" substrate layer could be made from more than one ply with a very thin oxide layer which performs as a water barrier on the inside surfaces as well as a very thin heat sealing layer such as an extruded amorphous polyester. After the printing and assembly operations are completed, then the throw away support layer could be removed.

A second web can be a relatively thick laminated structure including a PVC or Polyester film that is about 0.005-0.030" thick, and preferably about 0.010-0.015" thick. The second web can have a layer of pressure sensitive adhesive at about 1-5 mils thick on one or both sides. After this laminated structure of the second web is completed, it can be applied to the first web. In addition or alternatively, the second web can be pattern cut using any type of mechanical means to allow for cavities for the cells active materials as well as an optional cavity for the cell/battery contacts. A third web can be a relatively thin laminated structure the same and/or similar to the first web. The completed three web structure may have a pressure sensitive adhesive on either side to allow the individual device assembly to be applied as a label. The cell/battery may be of the thin cell type, such as disclosed in co-pending application Ser. No. 11/110,202 filed on Apr. 20, 2005 and Ser. No. 12/809,844 filed on Jun. 21, 2010 and U.S. Pat. Nos. 8,029,927 and 8,268,475, also incorporated herein by reference.

The various conductive inks described herein could be based on many types of conductive materials such as carbon, silver, gold, nickel, silver coated copper, copper, silver chloride, zinc and/or mixtures of these. For example, one such material that shows useful properties in terms of conductivity and flexibility is Acheson Colloids silver ink (Port Huron, Mich.) PM046. Furthermore, various circuits, electrical pathways, antennas, etc. that might be part of the printed circuitry can be made by etching aluminum, copper or similar type metallic foils that are laminated on a polymer such as Kapton or polyester substrate. This could be done with many types (sizes and frequencies) of pathways and/or antennas whether they are etched or printed.

A thin printed flexible electrochemical cell includes a printed cathode deposited on a printed cathode collector (e.g., a highly conductive carbon cathode collector) with a printed or foil strip anode placed adjacent to the cathode. Electrochemical cells/batteries of this type are described in U.S. patent application Ser. No. 11/110,202 filed on Apr. 20, 2005 and Ser. No. 12/809,844 filed on Jun. 21, 2010 and U.S. Pat. Nos. 8,029,927 and 8,268,475, the disclosures of which is incorporated herein by reference. The electrochemical cell/battery can also include a viscous or gelled electrolyte that is dispensed onto a separator that covers all or part of the anode and cathode, and a top laminate can then be sealed onto the picture frame or in a construction without the picture frame. This type of electrochemical cell was designed to be easily made by printing (e.g., through use of a printing press), and allows, for example, for the cell/battery to be directly integrated with an electronic application.

In various embodiments, the flat battery can include any of the battery structure or methodology described herein. The flat battery is on or integrating the substrate of the electrical device as a lower layer. That is, the flat battery can be disposed directly or indirectly on the substrate, and/or can integrate the substrate into the battery construction. While it is contemplated that the flat battery can be manufactured (i.e., printed) directly or indirectly on the substrate, it is preferably contemplated that the battery is separately manufactured (wholly or partially) and then attached directly or indirectly to the electrical device.

One example flat battery further integrates a top layer (which can also be a laminated film) arranged in a covering relationship over the substrate and the various battery elements as well as the electrical device. It is conceivable that the second substrate could even be used as the top layer of the battery. An extended area of the electrical device has a negative electrode, which can include a negative electrode extension. This extension is illustrated in the case where the negative electrode is a foil that is a continuation of the anode foil. In the case where the anode is printed zinc, then this extension can be printed silver. The positive electrode, which can similarly include a positive electrode extension, can be a silver printed contact on top of the carbon collector extension, or even just on top of the carbon collector. Additionally, the flat battery includes a cathode layer and an anode layer, each comprised of an electrochemical layer of a different composition that can interact through an electrolyte to create an electrical current.

Prior to applying the cathode layer, a cathode collector of highly conductive carbon is printed on the lower substrate using another dried or cured ink. In at least one embodiment, on the large area part of the cathode collector, the cathode layer is printed using an ink comprising manganese dioxide, a conductor such as carbon (e.g., graphite) for example, a binder, and water. The anode layer can be printed with a conductive zinc ink, or be provided as a zinc foil PSA laminate, either of which can be made about 0.20" wide (e.g., between 0.10"-0.40") and about 0.002" (0.001"-0.010") thick. After the electrode layers (cathode layer and anode layer) are in place, an optional "picture frame" can be placed around the electrodes and act as a spacer. The picture frame can comprise a die cut polymer laminate sheet, such as a polyester or polyvinyl chloride (PVC) etc, and can be further provided with two layers of pressure sensitive adhesive. A top pressure sensitive adhesive (PSA) layer seals the second substrate to the picture frame and a bottom PSA layer can be used to seal the bottom substrate to the picture frame. In an alternative embodiment, where the battery utilizes the second substrate as the top layer as discussed above, element could then represent the picture frame.

A typical picture frame assembly has a total thickness (excluding the thickness of the liners) of about 0.017" (about 0.005"-0.50"). The picture frame can be placed on the lower substrate after removing a bottom release liner so that the electrodes are centered within the frame. In some cases, to ensure a leak-free construction, a sealing and/or caulking adhesive, a heat sensitive sealant, and/or double sided PSA tape can be placed and/or printed on top of the anode layer and on top of cathode collector in an area that falls under the picture frame. The sealing adhesive can also be provided underneath the remainder of the picture frame.

As described herein, the electrochemical cell/battery can also include a viscous or gelled electrolyte. If the electrolyte is not part of the gelled coating, an aqueous cell electrolyte is provided to an absorbent material such as a "paper separator" that covers or partially covers both electrodes. To provide greater clarity, the electrolyte separator layer is shown with partial cutaways at both its top and bottom. The electrolyte can be an aqueous solution of $ZnCl_2$ at weight percent of about 27% (about 23%-43%) that could also contain a thickener, such as carboxymethylcellulose (CMC) or other similar materials at about 0.6% level (about 0.1%-2%). The electrochemical cell is completed by applying and sealing the second substrate (top laminate layer), such as over the picture frame or a construction without a picture frame using the PSA of the picture frame and/or with a heat seal without a picture frame.

Figure 15:
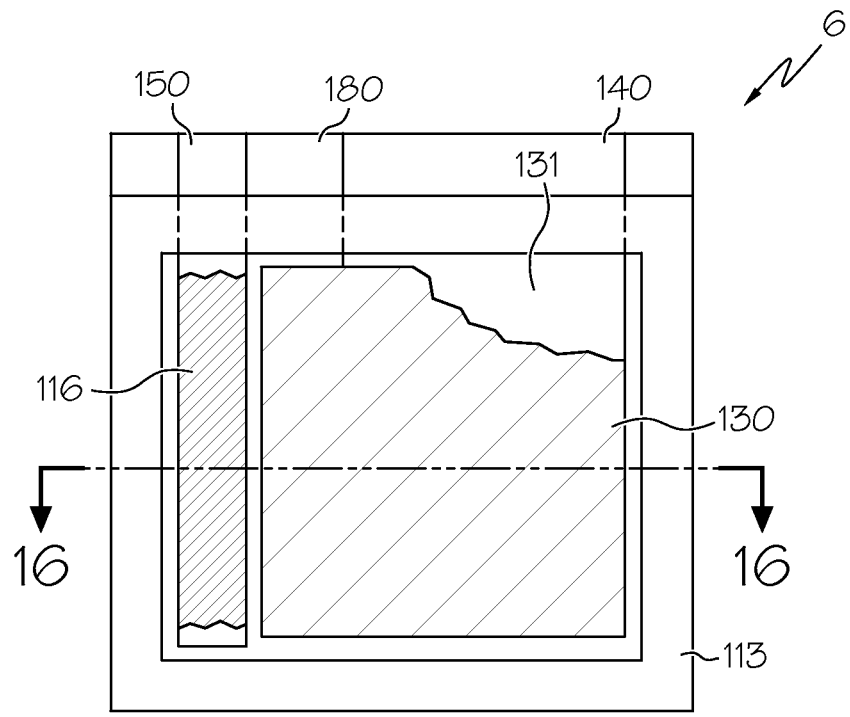
FIG. 15 illustrates a top view of a prior art cell.
Figure 16:
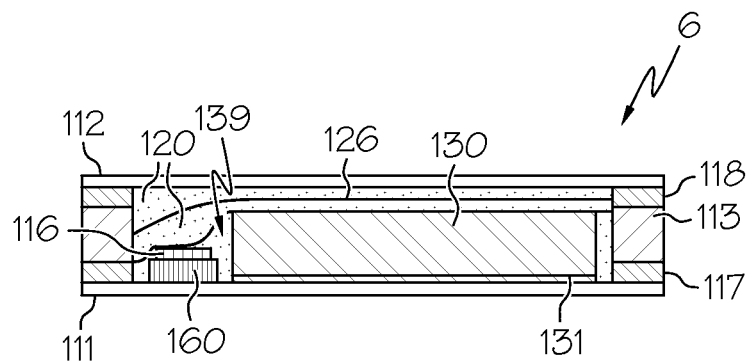
FIG. 16 illustrates a sectional view along line 16-16 of FIG. 15.

Turning briefly to FIGS. 15-16, one example prior art electrochemical cell will be described that generally includes a thin printed flexible electrochemical cell using an optional sealed "picture frame" structure, for example, that includes a printed cathode deposited on a printed cathode collector (e.g, a highly conductive carbon cathode collector) with a printed or foil strip anode placed adjacent to the cathode. Electrochemical cells/batteries of this type are described in U.S. patent application Ser. No. 11/378,520, the disclosure of which is incorporated herein by reference. The electrochemical cell/battery also includes a viscous or gelled electrolyte that is dispensed onto a separator that covers all or part of the anode and cathode, and a top laminate can then be sealed onto the picture frame. This type of electrochemical cell was designed to be easily made by printing (e.g., through use of a printing press), and allows, for example, for the cell/battery to be directly integrated with an electronic application.

The prior art electrochemical cell (see FIGS. 15-16), will be described which shows an embodiment of a completed unit power source 6 in plan and sectional views. The power source 6 includes a top laminated film substrate (layer) 112, a lower laminated film substrate (layer) 111, and an extended area 180 that has a silver printed positive contact 140 and negative contact 150. Additionally, the power source 6 includes a cathode layer 130 and an anode layer 116, each comprised of an electrochemical layer of a different composition that can interact through an electrolyte to create an electrical current. To provide greater clarity, power source 6 in FIG. 15 is shown without the top laminate 112.

Prior to applying the cathode layer 130, a cathode collector 131 of highly conductive carbon is printed on the lower laminated substrate 111. In at least one embodiment, on the large area part of the cathode collector 131, the cathode layer 130 is printed using an ink comprising manganese dioxide, a conductor such as carbon (e.g., graphite) for example, a binder, and water. The anode layer 116 can be printed as a conductive zinc ink, or be provided as a zinc foil (116) PSA (160) laminate as shown in the figures, either of which can be made about 0.20" wide and about 0.002" (0.001"-0.010") thick. After the electrode layers (anode layer 116 and cathode layer 130) are in place, an optional "picture frame" 113 may be placed around the electrodes. The picture frame 113 can comprise a die cut polymer laminate sheet, such as a polyester or polyvinyl chloride (PVC) etc, and can be further provided with two layers of pressure sensitive adhesive (118 on the top surface and 117 on the bottom surface). The top pressure sensitive adhesive (PSA) layer 118 seals the top laminate substrate 112 to the picture frame 113 and bottom PSA layer 117 can be used to seal the bottom laminate substrate 111 to the picture frame 113. This sealing can be done with or without heat.

The picture frame assembly has a total thickness (excluding the thickness of the liners) of about 0.015" (about 0.005"-0.50"). The picture frame can be placed on the lower laminate substrate 111 after removing a bottom release liner so that the electrodes are centered within the frame. In some cases, to ensure a leak-free construction, a sealing and/or caulking adhesive, a heat sensitive sealant, and/or double sided PSA tape can be placed and/or printed on top of the anode 116 and on top of cathode collector layer 131 in an area that falls under the picture frame 113. The sealing adhesive can also be provided underneath the remainder of the picture frame 113.

If the electrolyte is not part of the gelled coating, a cell electrolyte 120 is provided to an absorbent material such as a "paper separator" 126 (not shown in FIG. 15 for clarity, see FIG. 16) that covers or partially covers both electrodes. The electrolyte can be an aqueous solution of $ZnCl_2$ at weight percent of about 27% (about 23%-43%) that could also contain a thickener, such as carboxymethylcellulose (CMC) or other similar materials at about 0.6% level (about 0.1%-2%). The cell is completed by applying and sealing the top laminate 112 over the picture frame using the PSA and/or with a heat seal.

The electrochemical cells described above have a co-planar construction. A co-planar construction provides several advantages, in that they are easy to manufacture, provide consistent, reliable performance, and have their contacts on the same side of the cell/battery. Generally, one of the thin electrochemical cells described herein can provide about 1.5 volts. However, a number of cells can be electrically coupled together if higher voltages and/or high capacities are desired. For example, a 3 volt battery is obtained by connecting two 1.5 volt unit cells in series, although other voltages (e.g., generally multiples of 1.5 volts) and/or currents can be obtained by using unit cells with different voltages and/or by combining different numbers of cells together either in series and/or in parallel. Thus, applications using greater voltages can connect unit cells in series, whereas applications requiring greater currents and/or capacities, unit cells can be connected in parallel, and applications using both can utilize various groups of cells connected in series further connected in parallel. Thus, a variety of applications that use different voltages and currents can be supported using a variety of unit cell and/or battery configuration.

As described herein, the electrical device is provided with at least one electrical component powered by the flat battery. In various examples, the electrical component can be any or all of an integrated circuit, radio, audio/visual components, sensors, etc. and complementary elements or circuitry. The electrical component is on the substrate of the electrical device, and could be covered by a portion of the second substrate (such as where the second substrate is transparent or translucent). Additionally, the electrical component comprises at least one electrical contact for enabling electrical power supply. As shown, the electrical component comprises a pair of electrical contacts, such as one positive contact and one negative contact. The electrical contacts can be a portion of the electrical component, and/or can even be provided together with the substrate. Additional electrical contacts (including jumper bars) can be provided, such as where multiple batteries are used in parallel or serial configurations. It is contemplated that the electrical component(s) can be provided in various manners, such as by printing, laminating, physical placement, etc.

As will be further described, the electrical device can further comprise an electrical coupler assembly electrically connected between the at least one electrical contact and an electrode of the flat battery. The electrical coupler assembly can provide a first independent electrical connection between the electrical contact and the negative electrode, and a second independent electrical connection between the other electrical contact and the positive electrode. In addition or alternatively, the electrical coupler assembly can further comprise one or more switches for turning the electrical component on and/or off. With a completed circuit, the electrical coupler assembly enables electrical current to flow between the flat battery and the electrical component. Various example electrical coupling methods will be now discussed.

Figure 2:
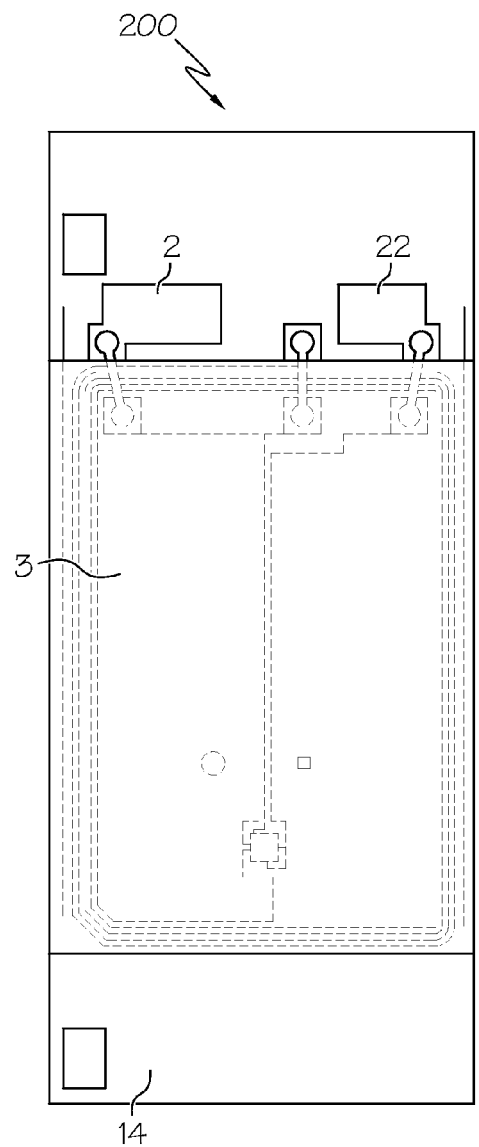
FIG. 2 is similar to FIG. 1, but illustrates an example adhesive over the electrical component.

Turning now to FIGS. 1-4B, one example method of manufacturing an electrical device uses an adhesive coupling method. FIG. 1 shows an example etched copper circuit 100 on a substrate, such as a polyester substrate 14 about 0.002" thick. The electrical component 10, in the shown example, is an active RFID circuit comprising at least a processor 12 and an antenna 13. It is contemplated that the substrate 14 can be flexible or rigid. The copper circuit is being used only as an example for this method of cell/battery attachment and it could be used with any commercial circuit material such as etched aluminum or printed carbon, silver, or any other metallic substrate etc. FIG. 2 shows a circuit sub-assembly 200 with contacts 2 and 22 as well as about 0.002" thick nonconductive pressure sensitive adhesive (PSA) 3 with the two release liners removed. The PSA layer 3 can be applied over the electrical component 10 (including processor 12 and antenna 13) and the substrate 14. The PSA layer 3 has thickness a range of about 0.0005-0.005", and can have a size similar to the size of the power source 6 that will be attached in FIG. 4. The power source 6 can be a single cell or include multiple cells.

Figure 3:
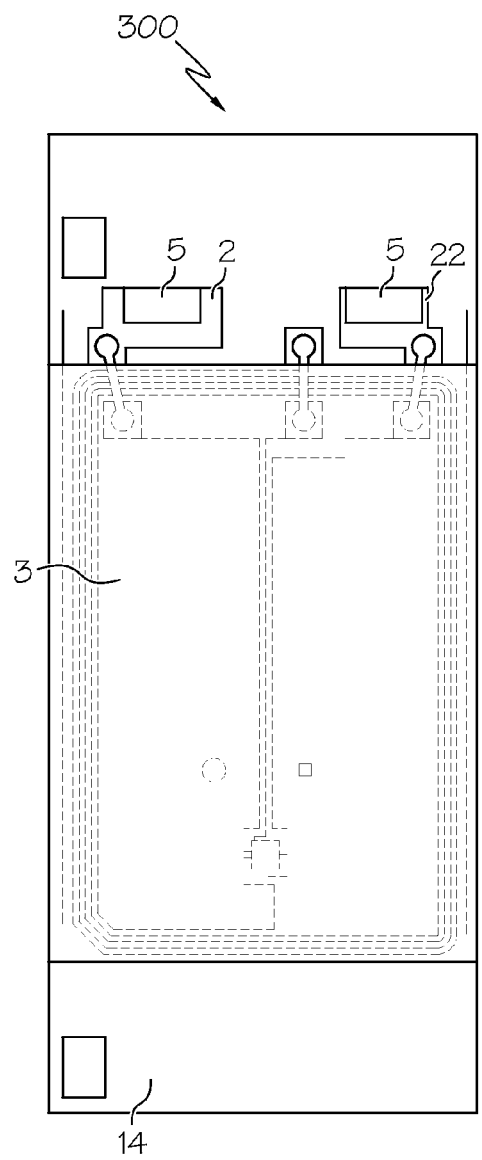
FIG. 3 is similar to FIG. 1, but illustrates an example conductive adhesive on an electrical contact.

FIG. 3 also shows the sub assembly 300 with double sided conductive PSA pads 5 placed over the two contacts 2 and 22 of the electrical circuit. These contact pads 5 can be, for example, about 0.2"×0.4" and could be of various materials such as 3M's #4190 which has conductivity in the X, Y, and Z directions and are made with a Cu and Ni coated and/or plated polyester fabric. Various other conductive materials can also be used. On both the top and bottom surfaces, there is a conductive PSA. The 3M #4190 is the preferred conductive PSA material due to its high degree of flexibility and its good bonding qualities when the circuit is flexed, though other similar conductive PSA can be used.

Figure 4:
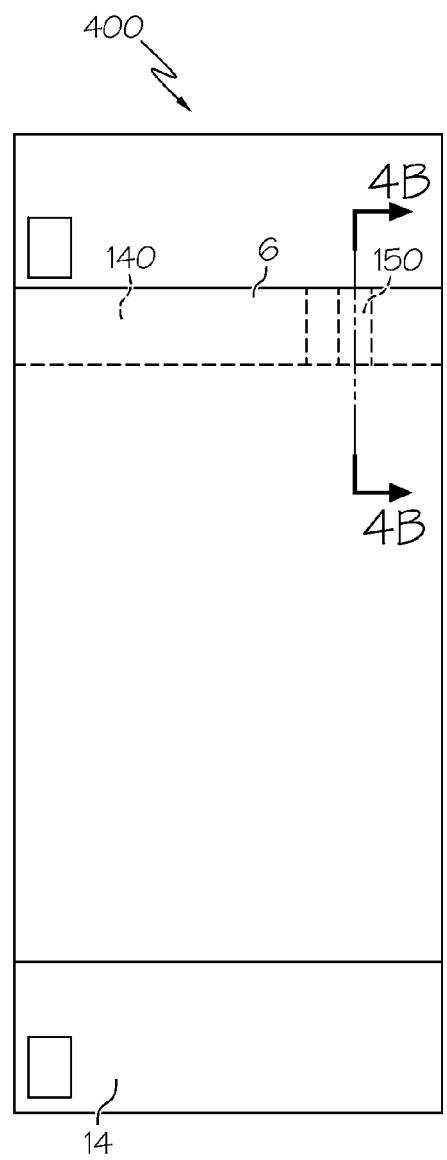
FIG. 4 is similar to FIG. 1, but illustrates an example flat battery coupled to the electrical component.
Figure 4B:
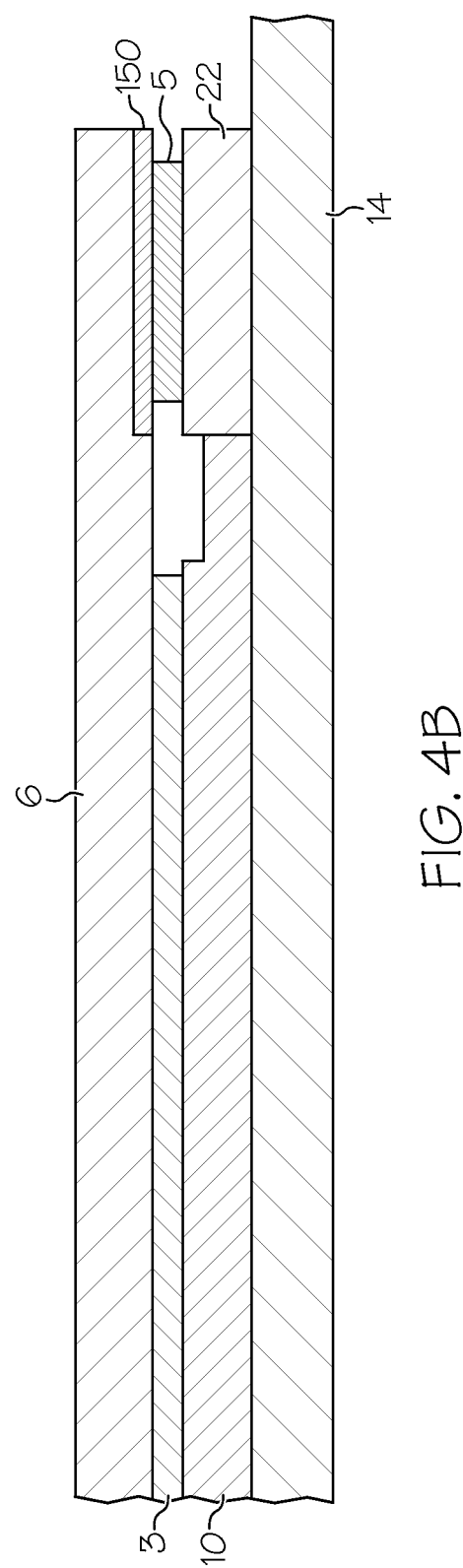
FIG. 4B is a sectional view through line 4B-4B of FIG. 4.

FIGS. 4-4B show the completed assembly 400 after the power source 6 is placed over the circuit 100 so that the contacts 2 and 22 match the negative and positive contacts 140, 150 of the power source 6, which in this case it is a unit cell of 1.5 volts. Although the contacts 2 and 22 are adhered to the contacts 140, 150 of the power source 6, for improved adhesive strength of the entire power source 6, can also be adhered to the circuit 100 with the PSA sheet 3.

As shown in the sectional view of FIG. 4B, the power source 6 (e.g., an electrochemical cell) is secured to the substrate 14 with a nonconductive PSA as well as through an electrically conductive connection 5 that provides both a structural connection and an electrical connection between the first electrical contact 22 and the first electrode contact 150. As shown here, the first electrical contact 22 is secured to the first electrode contact 150 by a conductive adhesive 5 that provides both the structural and electrical connection. Additionally, in the shown example, the power source 6 is secured to the substrate 14 through an intermediate non-conductive adhesive 3 located between the power source 6 and the substrate 14. Portions of the electrical component 10 may also be located between the power source 6 and the substrate 14.

In an example testing experiment, the circuits were "flexed" by running a web of attached assemblies through a simulated converting machine made for testing the flexibility of cells, batteries, with or without circuits attached. This testing machine had eight rolls. Testing of samples in this application was done at a speed of about 70 to 140 fpm for five hundred cycles. This testing showed that the flexibility and bonding characteristics was much better than that of commercial copper foil using a similar construction.

Figure 5:
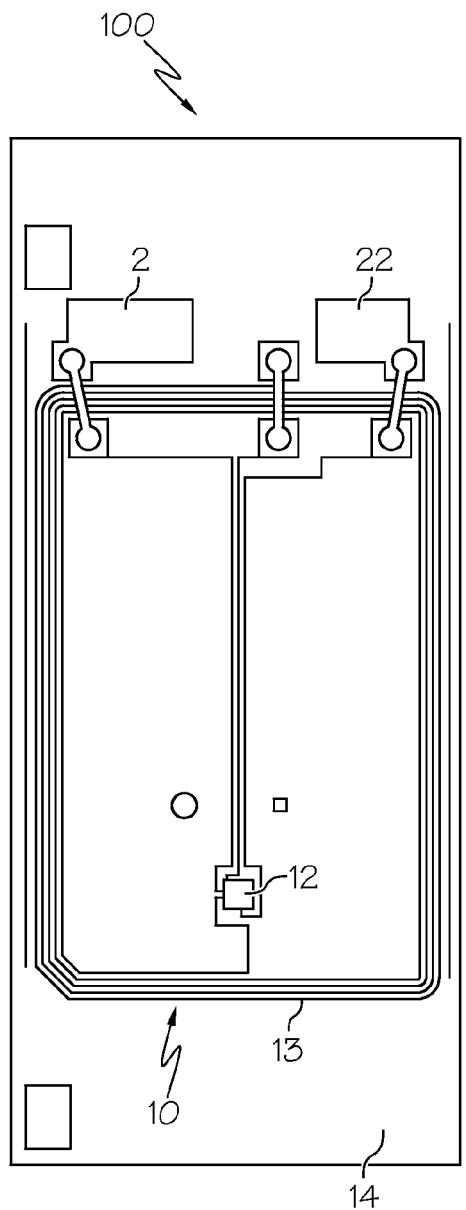
FIG. 5 illustrates a top view of another example electrical device comprising an electrical component.
Figure 6:
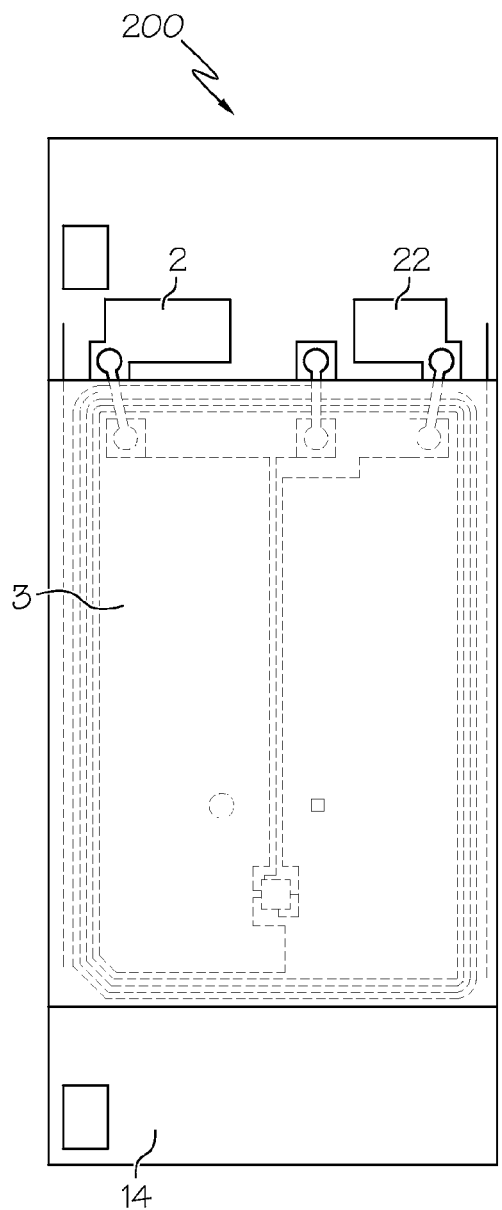
FIG. 6 is similar to FIG. 5, but illustrates an example adhesive over the electrical component.

Turning now to FIGS. 5-8B, another example method of manufacturing an electrical device uses an adhesive coupling method. FIG. 5 shows a typical etched copper circuit 100 on a polyester substrate 14 that is about 0.002" thick. As in the previous example embodiment, the copper circuit is being used only as an example for this method of cell/battery attachment and it could be used with any type of circuit and a commercial circuit material such as etched aluminum or printed carbon, silver or any other metallic substrate, etc. FIG. 6 shows a circuit sub-assembly 200 with contacts 2 and 22 as well as about 0.002" thick non-conductive pressure sensitive adhesive (PSA) 3 with the two release liners removed. The PSA layer 3 has thickness a range of about 0.0005-0.005", and the size is similar to the size of the power source that will be attached in FIG. 7.

FIG. 7 shows a sub-assembly 500 of circuit 100, PSA layer 3 (not visible) and power source 6 with the relatively narrow negative contact 150 and the relatively wide positive contact 140. FIG. 8 shows the completed assembly of the power source 6 and circuit 100. The assembly 600 is completed by attaching a single sided conductive pads 50 to connect the circuit contacts 2 and 22 to the power source contacts 140, 150. These contact pads 50 (0.2"×0.4") could be of various materials such as 3M's #3190 which has conductivity in the X and Y directions and is made from a coated and/or plated polyester fiber. The 3M #3190 is the preferred conductive PSA material due to its high degree of flexibility and its good bonding qualities when the circuit is flexed, though other similar conductive PSA can be used. It is noted that if the same circuit 100 is used as in the previously discussed embodiment, then the cell contact locations may reversed or otherwise correspond to match the polarity of the circuit 100.

Figure 8B:
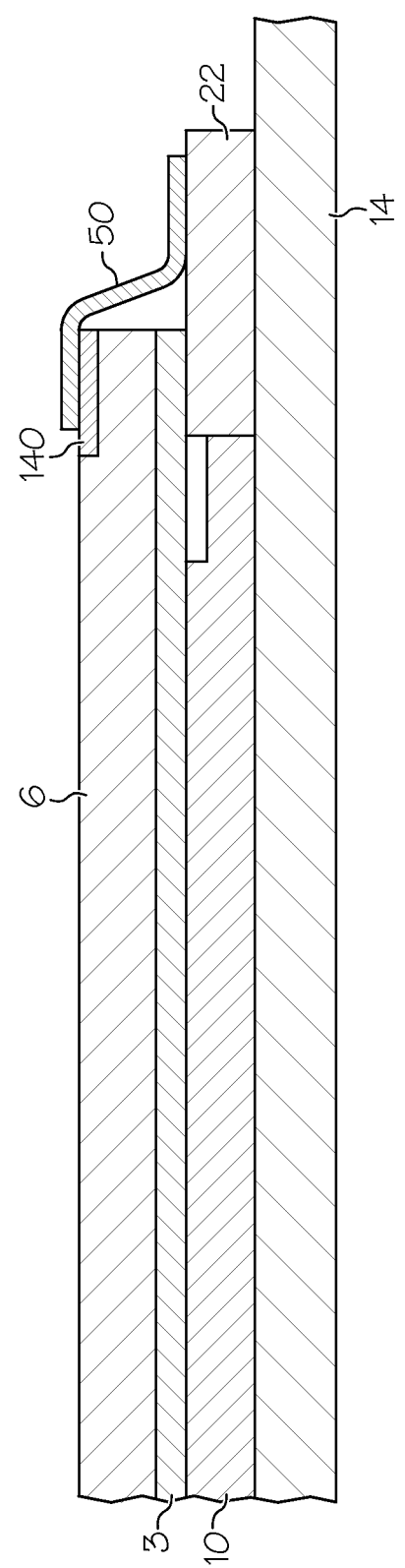
FIG. 8B is a sectional view through line 8B-8B of FIG. 8.

On the bottom surface of the contact pads 50 there is a conductive PSA which makes the physical and electrical connections from the circuit to the power source 6. FIGS. 8-8B show the completed assembly 600 after the power source 6 is placed over the circuit 100 so that the contacts 2 and 22 are aligned with match the negative and positive contacts 140, 150 of the power source and in this case, it is a unit cell of 1.5 volts. Although the contacts 2 and 22 are adhered to the contacts of the power source 6 with the conductive pads 50, for improved adhesive strength the entire assembly power source 6 can be adhered to the circuit 100 with the a PSA sheet 3.

As shown in the sectional view of FIG. 8B, the power source 6 (e.g., an electrochemical cell) is secured to the substrate 14 through an electrically conductive connection (contact pads 50) that provides both a structural connection and an electrical connection between the first electrical contact 22 and the first electrode contact 140. As shown here, the conductive adhesive pad 50 is placed onto both of an upper exposed surface of the first electrical contact 22 and an upper exposed surface of the first electrode contact 140 to provide both the structural and electrical connection. This same type of construction could also be used to connect electrode contact 150 to the electrical contact 2. Additionally, in the shown example, the power source 6 is secured to the substrate 14 through an intermediate non-conductive adhesive 3 located between the power source 6 and the substrate 14. The adhesive 3 may further extend to cover a portion of the first electrical contact 22 between the power source 6 and the substrate 14. Portions of the electrical component 10 may also be located between the power source 6 and the substrate 14.

In an example testing experiment, the circuits were "flexed" by running a web of attached assemblies through a test converting machine with eight rolls at a speed of about 70 to 140 fpm for five hundred cycles. This testing showed that the flexibility and bonding characteristics was much better than that of commercial copper foil of a similar construction.

Turning now to FIGS. 9-14, yet another example method of manufacturing an electrical device is described. While the previous two designs used an adhesive (conductive and non-conductive) design, the following embodiment uses a mechanical coupling method that may optionally be used together with an adhesive coupling method.

Figure 9:
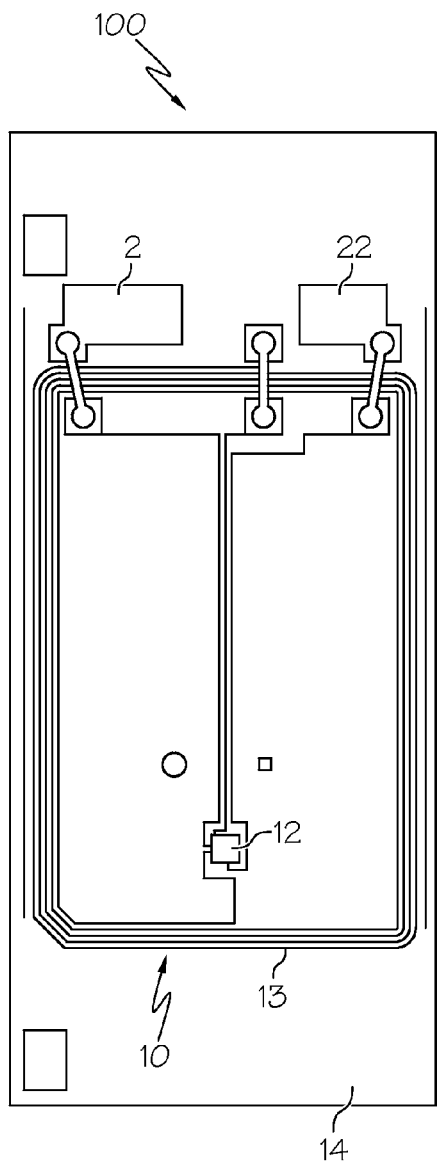
FIG. 9 illustrates a top view of yet another example electrical device comprising an electrical component.

FIG. 9 shows a typical etched copper circuit 100. As in the case of previous embodiments, the copper circuit is being used only as an example for this method of cell/battery attachment could be used with any commercial circuit material such as etched aluminum, printed carbon, silver or other metallic substrate, etc.

Figure 10:
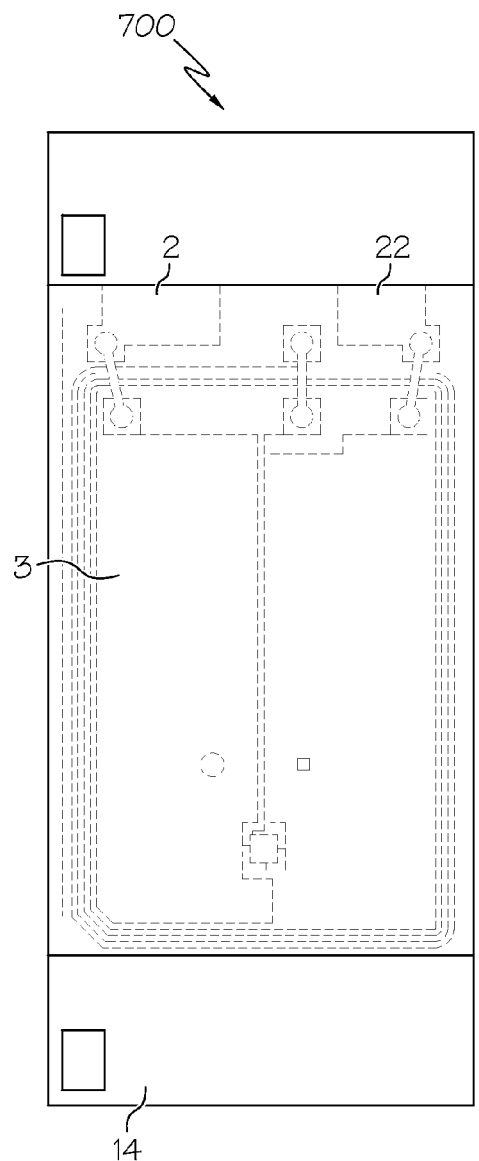
FIG. 10 is similar to FIG. 9, but illustrates an example adhesive over the electrical component.
Figures 11, 12:
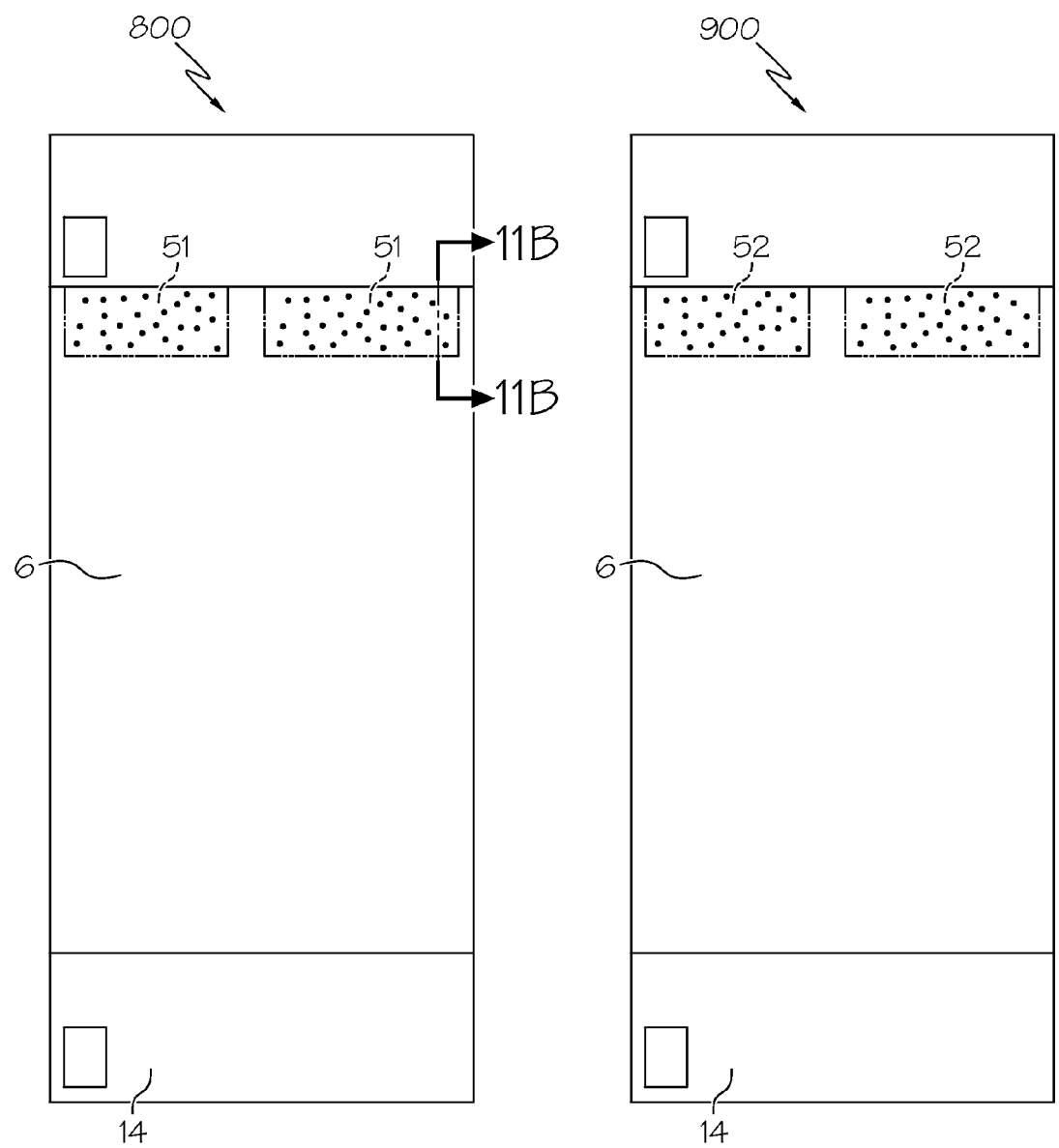
FIG. 11 is similar to FIG. 9, but illustrates an example flat battery coupled to the electrical component.
FIG. 12 is similar to FIG. 9, but illustrates example perforations through an electrical contact of the flat battery.

FIG. 10 shows the first assembly step, (sub-assembly 700). In this step a non-conductive layer, such as a thin layer (~0.002") of non-conductive double sided PSA 3 that generally has the same size as the cell/battery including its electrical contact area, is applied to circuit 100. The top edge of PSA 3 is applied so that its top edge generally lines up with the top edge of circuit contacts 2, 22. After the release liners are removed, the power source which in this example is a printed unit power source 6 is placed over the PSA 3 with the cell contacts 140, 150 facing down towards the substrate 14 and aligned with the circuit contacts 2 and 22 which is the top edge of PSA 3 as shown in FIGS. 11, 11B, and 12.

Figure 13:
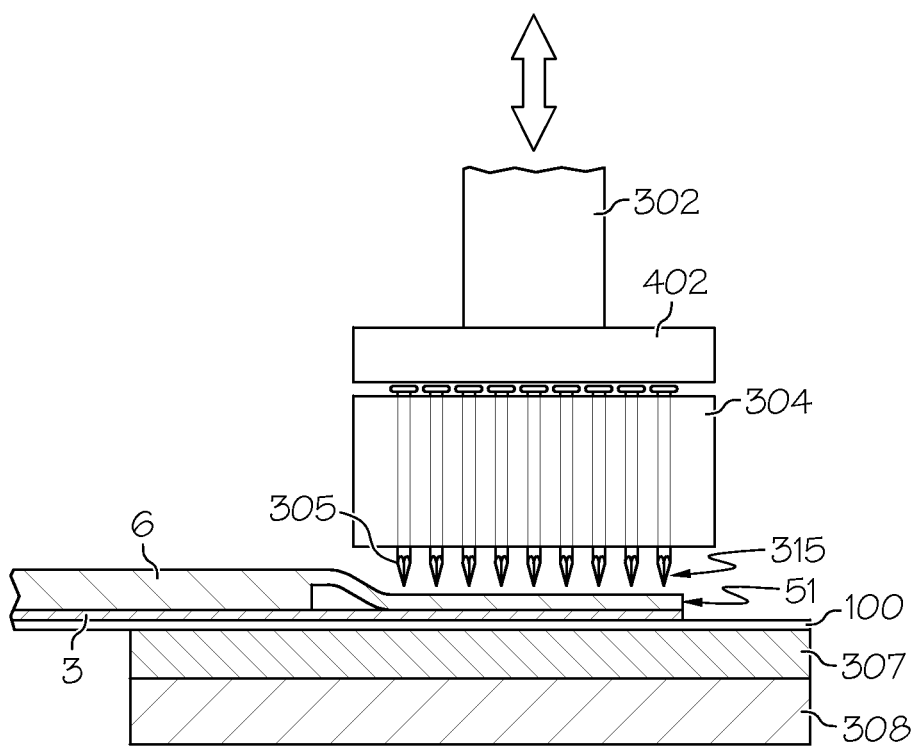
FIG. 13 is a partial sectional view illustrating an example perforation operation.
Figure 14:
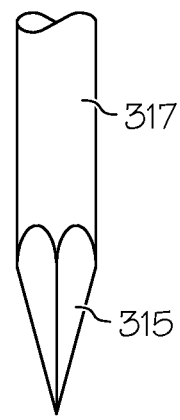
FIG. 14 is a detail view of an example perforating element.

After the cell is in place, the contact areas 51 are perforated. The contact areas 51 are located generally about the interface of the circuit contacts 2, 22 and respective electrode contacts 140, 150. This perforation of the sub-assembly 800 is done to make electrical contact between power source 6 contacts 140, 150, and the circuit 100 contacts 2 and 22 which were separated by the PSA layer 3. This "perforation" can be accomplished in the following example manner, as shown in FIG. 13, using one or more penetration members. A perforation tool, which can be made from a single or multiple parts, includes a force head 302 which could be part of a press or the like, an insulating plate 402 which would isolate the penetration members, for example conductive metallic nails 305, from each other thus preventing shorting of the power source 6 when both of the contacts 2 and 22 are perforated at the same time, and holding member 304, which can be an insulating block that functions as the holding mechanism for the nails 305. The nails 305 and holding member 304 may or may not form a portion of the force head 302 and/or insulating plate 402. In one example, these nails 305 are high precision ground nails. The force head 302 can drive a single or a plurality of penetration members to cause the perforation of the cell contacts 140, 150. In one example, a plurality of the penetration members can be driven substantially simultaneously by the force head 302. In another example, the penetration members could be driven individually, such as one-at-a-time, by the force head 302. In another example, a single or a plurality of the penetration members can be driven sequentially or in a pattern.

It is contemplated that the nails 305 may also be electrically non-conductive to avoid problems of electrical shorting. The nails 305 can have various geometries, such as 0.875" long with a diameter of 0.058" (approximately #17 size), but many other sizes and/or shapes could also be used. The nails 305 are arranged in various configurations, such as a pattern that would provide a desired number of perforations in the circuit contacts area 2 and 22 as well in the contact areas 140 and 150 of the circuit. For example, the penetration members can be arranged so as to increase, such as maximize, the number of perforations to obtain a strong mechanical and electrical connection. It is understood, however, that the number of perforations must be balanced against the structural integrity of the cell contact area 51 and/or circuit electrical contact.

In the perforation process, the nails 305 perforate the cell contact area 51 consisting of cell contacts 140, 150, the PSA layer 3, and the circuit contacts 2 and 22. A resilient pad 307, such as a rubber pad or the like, may optionally be used to cushion the mechanical force applied during the perforation operation. This operation may further be supported by a support plate 308 or another surface.

The direction of the perforation could be done from either side of the circuit. This process controls the depth of the nails 305 penetration to a desired depth, such as about 0.125", by controlling the length of the exposed nail point 315 below the holding member 304 to the desired depth (e.g., 0.125"). In addition or alternatively, the penetration depth of the penetration members 305 could be limited by controlling the depth of penetration with a machine stop or with tooling. The nail point 315 on shaft 317 is shown as an enlargement in FIG. 14. This nail point 315 shape produces a similar shape in the perforated area of the cell contact area 51, the PSA layer 3 and the circuit area of the contacts 2 and 22. In the perforation process, the nails 305 puncture the cell contact area 51 which forms many "funnel shaped" projections which then puncture the thin PSA layer 3, as illustrated schematically in FIG. 11B. Due it's thinness and the "funnel forming" of the projection operation, the PSA layer 3 ruptures and a hole is opened, thus allowing the cell contacts 140, 150 to make physical and electrical contact to the circuit contacts 2 and 22 while they are being punctured and formed by the nails 305.

It is contemplated that the "funnel shaped" projections may cause portions of the cell contacts 140, 150 to at least contact, and possibly puncture and extend a distance into, the circuit contacts 2, 22 and/or the substrate 14. For example, as shown in FIG. 11B, three different "funnel shaped" projections are illustrated. The first example projection 306A is shown puncturing and extending through the PSA layer 3, the circuit contact 22 and at least partially into the substrate 14 (although it could also extend through the substrate 14). The next example projection 306B is shown puncturing and extending through the PSA layer 3 and puncturing and extending partially into the circuit contact 22. The next two example projections 306C are shown puncturing and extending through the PSA layer 3 and contacting but not puncturing the circuit contact 22.

After the perforations are made in the assembly 800 of FIG. 11 (which may include any or all of the example projections 306A, 306B, 306C, this area may then be sealed 52 in an operation similar to a bag sealing operation, with or without pressure and/or heat, to form the completed assembly 900 shown in FIG. 12. As noted, the sealing operation can use heat, pressure, or a combination of heat and pressure. In this operation, the sealing operation (with or without pressure and/or heat) generally flattens the assemblies' perforations in combination with the PSA layer 3 and seals this area together to allow for a strong joint which enforces the electrical connection as well as the mechanical strength between the circuit contacts 2 and 22 to the power source 6 contacts 140, 150 thus creating a durable electrical and mechanical connection. In addition or alternatively, it is contemplated that the "funnel shaped" holes made by the perforating operation can be filled with an electrically conductive or non-conductive material. In addition or alternatively, it is contemplated that any of the electrical coupling operations of the various embodiments discussed herein may further partially or fully laminate a structural support layer over the combined electrical component and battery to provide increased strength, durability, environmental resistance, etc.

As shown in the sectional view of FIG. 11B, the power source 6 (e.g., an electrochemical cell) is secured to the substrate 14 through a non-conductive PSA and an electrically conductive connection (perforations) that provides both a structural connection and an electrical connection between the first electrical circuit contact 22 and the first electrode contact 150. As shown here, the first electrode 150 is arranged over the first contact 22, such as in an at least partially covering relationship. The first electrode 150 is perforated such that at least a portion of the first electrode 150 is driven towards the first electrical contact 22 to be both structurally connected and electrically connected to the first electrical contact 22. If the non-conductive layer 3 is present, the first electrode 150 is perforated such that at least a portion of the first electrode 150 is forced through the non-conductive spacer layer 3 to be electrically connected to the first electrical contact 22 to provide both the structural and electrical connection. Additionally, in the shown example, the power source 6 is secured to the substrate 14 through an intermediate non-conductive adhesive 3 located between the power source 6 and the substrate 14. The adhesive 3 extends to cover a portion or all of the first electrical contact 22 between the power source 6 and the substrate 14. Portions of the electrical component 10 may also be located between the power source 6 and the substrate 14.

In an example testing experiment, the reliability was confirmed by testing the assemblies in the same manner as was done with the assemblies made with conductive PSA. These circuit assemblies 900 were "flexed" by running a web of attached assemblies through a test converting machine with eight rolls at a speed of about 70 to 140 fpm for five hundred cycles. This testing showed that the flexibility and bonding characteristics was equal or better than the reliable assemblies made with the conductive PSA.

It is contemplated that the electrochemical cell can be secured to the substrate through an electrically conductive connection that can utilize various combinations of the methods described herein (e.g., conductive adhesive 5, contact pads 50, perforations). For example, one of the cell electrodes 140, 150 can utilize one method, while another of the cell electrodes 140, 150 uses another method. Intermediate elements, additional elements and/or multiple cells can be electrically connected using various combinations of the methods.

Example manufacturing schemes of the power source 6 of FIGS. 15-16 will now be discussed. To make the manufacturing process of a cell/battery more efficient and/or achieve greater economies of scale, the cell/battery can be manufactured using a pouch-filling operation. In another example, the cell/battery can be manufactured using a generally continuous web in a reel-to-reel printing process to provide production at high speeds and low cost. An example manufacturing procedure is described in the following paragraphs. In this example procedure, the cell/battery proceeds through numerous stations that are compatible with a high-speed printing press running a roll-to-roll setup. Though not further described herein, the processing and assembly could be integrated with the manufacture of the smart card electric device or elements thereof to be powered by the battery, such as with the electrical component, etc.

According to available printing presses, the cells could be made with one pass, or multiple passes, on a given press, for example. As an example, two rows of individual cells on the web; however, the number of rows is limited only to the size of the unit cells and the maximum web width that the press can process. Because there may be numerous steps, thereby likely utilizing a long and complicated press, some of these steps could be done offline, as well as some of the materials, could be modified and/or multiple passes of a press or multiple presses could be used. Some modified process summaries will be shown after the initial discussion is completed. Moreover, any or all of the printing steps can be performed by screen printing, such as by flat bed screens or even rotary screen stations. Additionally, one skilled in the art would realize that one printing press with more than five stations could be difficult to find and or to operate, and thus the following discussion of the process could occur on one or more presses or even multiple passes through one press.

During manufacturing, various optional operations may or may not occur. For example, the optional operations could include one or both of heat stabilization of the web and graphics printing (which could include logos, contact polarities, printing codes and the addition of registration marks on the outside surface of web). If these optional printing operations occur on the web, then the web can be turned over and the functional inks can be printed on the inside surface, (i.e., the heat seal layer).

One skilled in the art would realize that there are many methods, materials, and sequences of operations that could be used, and that more or less, similar or different, numbers of stations could also be utilized. Still, it is to be understood that the following process can also be utilized for the manufacture of various other integrated electrical devices. Further, for the purposes of clarity only two columns of batteries will be described and illustrated with the understanding that such description can similarly apply to other columns. Moreover, it is to be understood that any or all of the following elements can include any of the various materials, chemical compositions, etc. described throughout this document. Additionally, the various steps are intended to be merely example steps, and it is to be understood that the steps can include various other steps, alternatives, etc. as discussed herein.

As discussed herein, any or all of the substrates can be provided as generally continuous webs that can be processed through a "reel-to-reel" style manufacturing process. For example, a first substrate can be provided as a generally continuous web from a source station, which can be a source roll or the like. Some or all of the various processing steps, such as, for example, the steps of providing said cathode and anode collections, cathode layer, providing said anode layer, contacts, printed circuitry, and some and/or all of the components of the electrical circuit, etc., can then be performed by passing the generally continuous web through a printing station, or even multiple printing stations. In addition or alternatively, the process can be adapted to pass the web through the printing station in multiple passes. Finally, the completed batteries on the generally continuous web can be collected at a take-up station, which can include a collection roll.

The manufacturing process can include various other stages, steps, etc. For example, prior to or after the printing station, the web can pass through an auxiliary station wherein various electrical components be provided. Moreover, any or all of the various layers, substrates, etc. can be provided by supplemental rolls along the process. For example, an additional substrate (i.e., a spacer layer) can be provided by a supplemental roll via a supplemental web. Though described as near the beginning of the printing station, it is to be understood that any or all of the supplemental webs can be provided at various locations along the manufacturing process. In addition or alternatively, waste material, such as release layers or the like, can be removed from as a waste web and taken-up by a waste roll or the like. Various other pre-processing and/or post-processing stations, steps, etc. can also be included. It is to be understood that the various stations, rolls, etc. of the described process can be utilized in various orders, and additional equipment may even be provided (e.g., idler rollers, tension rollers, turn-bars, slit or perforators, etc.) to facilitate the "reel-to-reel" process.

Various other additional steps can be utilized to provide additional structure, features, etc. to the completed battery cells and electrical components. In one example, an outer portion of the device, such as the second substrate "top cover", can be provided with a method of attaching the battery cells to another object, surface, etc. For example, the second substrate can include a pressure sensitive adhesive, another adhesive layer, a liquid or hot-melt adhesive, etc. In another example, an outer portion of the battery cells, such as the second substrate "top cover", can be provided with printed indicia or even a label or the like.

Thin printed flexible batteries can have many potential applications, which can include one or more of the following generally categories as examples:

1. RFID assemblies;
2. Advertising and promotion;
3. Toys, novelties, books, greeting cards, and games;
4. Inventory tracking and control such as (smart RFID tags);
5. Security tags;
6. Condition indicators such as temperature, humidity, etc.;
7. Skin patches that apply iontophoresis or other electrical function for the purpose of drug delivery, wound care, pain management and/or cosmetics;
8. Healthcare products such as smart diapers, incontinence products, etc.; and
9. Smart cards, with an integrated circuit, radio, audio/visual components, etc.
10. Interactive packaging The invention has been described hereinabove using specific examples and embodiments; however, it will be understood by those skilled in the art that various alternatives may be used and equivalents may be substituted for elements and/or steps described herein, without deviating from the scope of the invention. Modifications may be performed to adapt the invention to a particular situation or to particular needs without departing from the scope of the invention. It is intended that the invention not be limited to the particular implementations and embodiments described herein, but that the claims be given their broadest interpretation to cover all embodiments, literal or equivalent, disclosed or not, covered thereby.

What is claimed is:

1. A method of manufacturing an electrical device, comprising the steps of:
   providing a substrate;
   providing an electrical component on the substrate;
   providing a first electrical contact on the substrate that is electrically connected to the electrical component;
   providing an electrochemical cell on or integrating the substrate for providing electrical energy to said electrical component, said electrochemical cell comprising at least one electrochemical layer comprising a cured or dried ink and a first electrode contact electrically connected to said at least one electrochemical layer;

securing the electrochemical cell to the substrate through an electrically conductive connection that provides both a structural connection and an electrical connection between the first electrical contact and the first electrode contact, providing a second electrical contact on the substrate that is electrically connected to the electrical component;

providing the electrochemical cell with a second electrochemical layer and a second electrode contact electrically connected to said second electrochemical layer; and securing the electrochemical cell to the substrate through an electrically conductive connection that provides both a structural connection and an electrical connection between the second electrical contact and the second electrode contact.

2. The method of claim 1, further comprising the step of securing the electrochemical cell to the substrate through an intermediate non-conductive adhesive located between the electrochemical cell and the substrate.

3. The method of claim 1, wherein the cured or dried ink includes zinc.

4. The method of claim 1, wherein said electrochemical cell comprises at least one electrochemical layer including zinc foil.

5. A method of manufacturing an electrical device, comprising the steps of:
providing a substrate;
providing an electrical component on the substrate;
providing a first electrical contact on the substrate that is electrically connected to the electrical component;
providing an electrochemical cell on or integrating the substrate for providing electrical energy to said electrical component, said electrochemical cell comprising at least one electrochemical layer comprising a cured or dried ink and a first electrode contact electrically connected to said at least one electrochemical layer;
securing the electrochemical cell to the substrate through an electrically conductive connection that provides both a structural connection and an electrical connection between the first electrical contact and the first electrode contact,
arranging the first electrode contact over the first electrical contact; and
perforating the first electrode contact such that at least a portion of the first electrode contact is forced into contact with the first electrical contact to be electrically connected to the first electrical contact.

6. The method of claim 5, wherein the step of securing the electrochemical cell to the substrate further comprises securing the first electrical contact to the first electrode contact by a conductive adhesive.

7. The method of claim 6, further comprising the step of placing the conductive adhesive between the first electrical contact and the first electrode contact.

8. The method of claim 6, further comprising the step of placing the conductive adhesive onto both of an upper exposed surface of the first electrical contact and an upper exposed surface of the first electrode contact.

9. The method of claim 5, wherein the step of perforating the first electrode contact is performed using a plurality of penetration members driven substantially simultaneously by a force head.

10. The method of claim 9, wherein at least one of the penetration members is electrically non-conductive.

11. The method of claim 9, wherein at least two of the penetration members are electrically conductive and are coupled by a non-conductive holding member to inhibit electrical connection between said at least two of the penetration members.

12. The method of claim 11, further comprising the step of limiting a penetration depth of the penetration members relative to the electrochemical cell by fixing a length of the penetration members that extend from the non-conductive holding member.

13. The method of claim 5, wherein at least a portion of the first electrode contact is forced through the first electrical contact and punctures the substrate.

14. The method of claim 5, further comprising the step of providing a non-conductive spacer layer between the first electrode contact and the first electrical contact.

15. The method of claim 5, further comprising the step of heat sealing the first electrode contact to the first electrical contact.

16. The method of claim 5, further comprising the step of pressure sealing the first electrode contact to the first electrical contact.

17. The method of claim 5, further comprising the step of pressure sealing and heat sealing the first electrode contact to the first electrical contact.

18. A method of manufacturing an electrical device, comprising the steps of:
providing a substrate;
providing an electrical component on the substrate;
providing a first electrical contact on the substrate that is electrically connected to the electrical component;
providing an electrochemical cell on or integrating the substrate for providing electrical energy to said electrical component, said electrochemical cell comprising at least one electrochemical layer comprising a cured or dried ink and a first electrode contact electrically connected to said at least one electrochemical layer;
arranging the first electrode contact over the first electrical contact; and
perforating the first electrode contact such that at least a portion of the first electrode contact is both structurally connected and electrically connected to the first electrical contact.

19. The method of claim 18, further comprising the steps of:
providing a non-conductive spacer layer between the first electrode contact and the first electrical contact; and
perforating the first electrode contact such that at least a portion of the first electrode contact is forced through the non-conductive spacer layer to be electrically connected to the first electrical contact.

20. The method of claim 18, wherein the step of perforating the first electrode contact is performed using a plurality of penetration members driven substantially simultaneously by a force head.

21. The method of claim 20, wherein at least one of the penetration members is electrically non-conductive.

22. The method of claim 20, wherein at least two of the penetration members are electrically conductive and are coupled by a non-conductive holding member to inhibit electrical connection between said at least two of the penetration members.

23. The method of claim 20, further comprising the step of limiting a penetration depth of the penetration members relative to the electrochemical cell by fixing a length of the penetration members that extend from a non-conductive holding member.

* * * * *